(12) United States Patent
Kurokawa

(10) Patent No.: US 9,883,129 B2
(45) Date of Patent: Jan. 30, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventor: Yoshiyuki Kurokawa, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 15/274,312

(22) Filed: Sep. 23, 2016

(65) Prior Publication Data

US 2017/0094220 A1    Mar. 30, 2017

(30) Foreign Application Priority Data

Sep. 25, 2015 (JP) ................................. 2015-188047

(51) Int. Cl.
| | |
|---|---|
| H04N 5/3745 | (2011.01) |
| H01L 27/146 | (2006.01) |
| H04N 5/378 | (2011.01) |
| H04N 9/804 | (2006.01) |

(52) U.S. Cl.
CPC ..... *H04N 5/3745* (2013.01); *H01L 27/14616* (2013.01); *H01L 27/14627* (2013.01);
(Continued)

(58) Field of Classification Search
CPC .... H04N 5/3745; H04N 5/378; H04N 9/8042; H01L 27/14616; H01L 27/14627; H01L 27/14634

See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Tuan Ho
(74) *Attorney, Agent, or Firm* — Nixon Peabody LLP; Jeffrey L. Costellia

(57) ABSTRACT

The present invention provides a semiconductor device which enables data compression with a small amount of data. The present invention is a semiconductor device which includes a pixel portion, a memory, a first circuit, and a second circuit. The pixel portion has a function of obtaining imaging data. The first circuit has a function of performing discrete cosine transform on the imaging data, and generating first data. The first data is analog data, and the memory has a function of retaining the first data. The second circuit has a function of performing discrete cosine transform on the first data, and generating second data. The memory includes a first transistor, which includes an oxide semiconductor in a channel formation region, and a second transistor, in which a channel formation region is provided in a Si wafer.

12 Claims, 25 Drawing Sheets

(52) U.S. Cl.
CPC ....... *H01L 27/14634* (2013.01); *H04N 5/378* (2013.01); *H04N 9/8042* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 7,936,818 B2 * | 5/2011 | Jayant .................... H04N 19/00 375/240.05 |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,836,626 B2 | 9/2014 | Ikeda |
| 9,099,562 B2 | 8/2015 | Akimoto et al. |
| 9,111,824 B2 | 8/2015 | Ikeda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2012/0188375 A1* | 7/2012 | Funabashi ............ G07C 5/0866 348/148 |
| 2015/0340392 A1 | 11/2015 | Ikeda |
| 2015/0340513 A1 | 11/2015 | Akimoto et al. |
| 2016/0172410 A1 | 6/2016 | Kurokawa |
| 2016/0295152 A1 | 10/2016 | Kurokawa |
| 2017/0154678 A1* | 6/2017 | Nakagawa ......... G11C 16/0466 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2011-171702 A | 9/2011 |
| JP | 2013-042482 A | 2/2013 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID

(56) References Cited

OTHER PUBLICATIONS

International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Mative Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advance Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", Nirim Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Full Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m >4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel Using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices MEeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

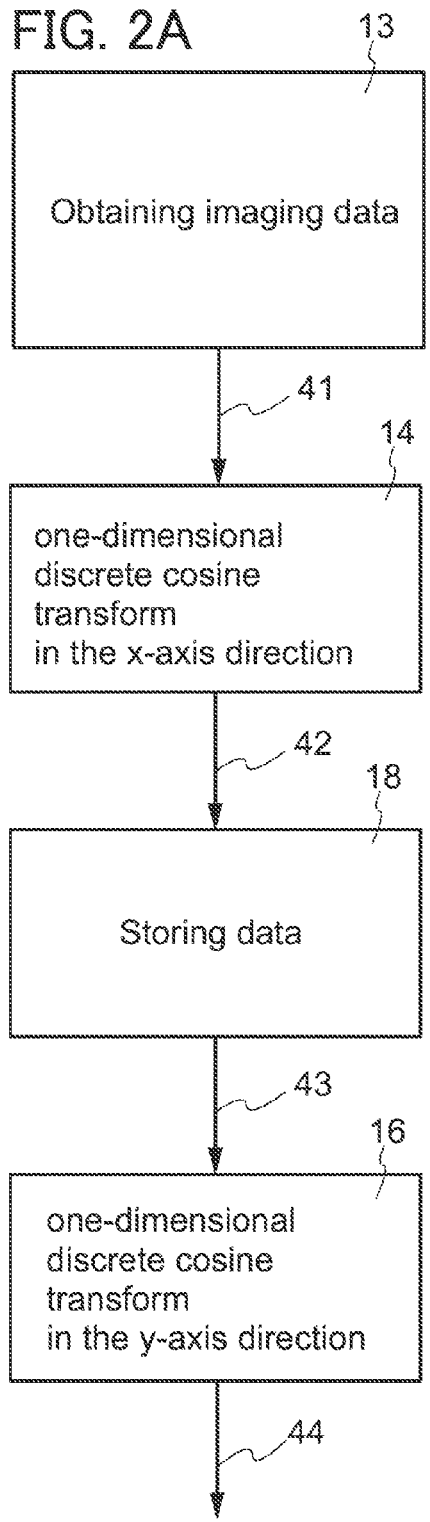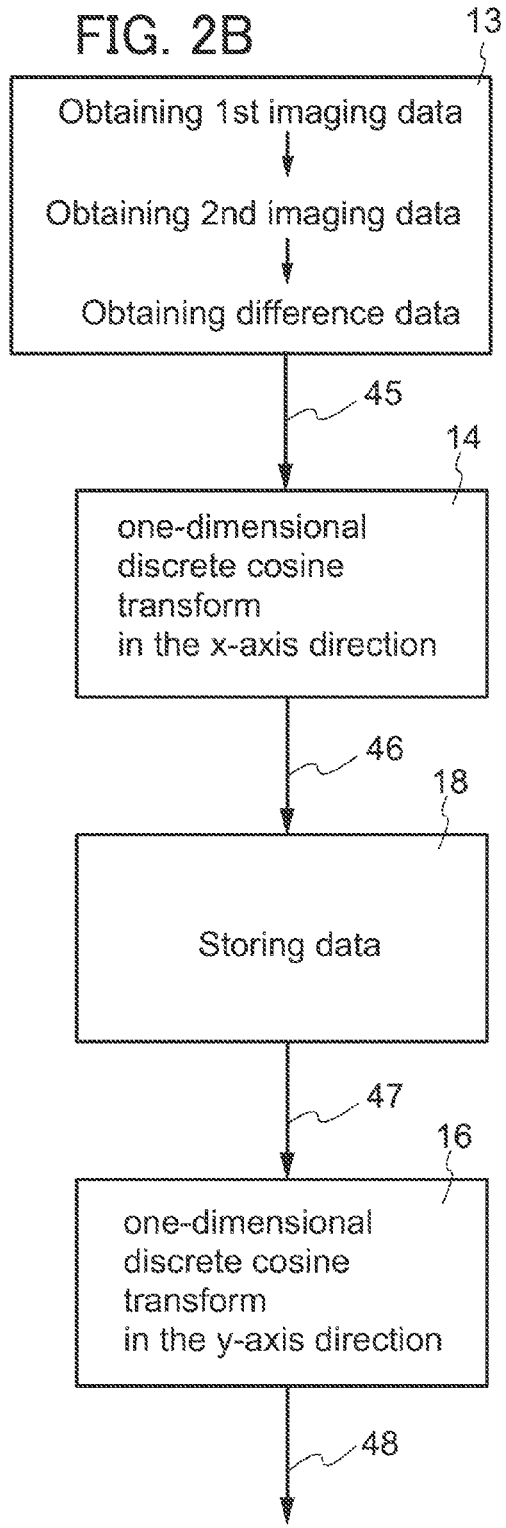

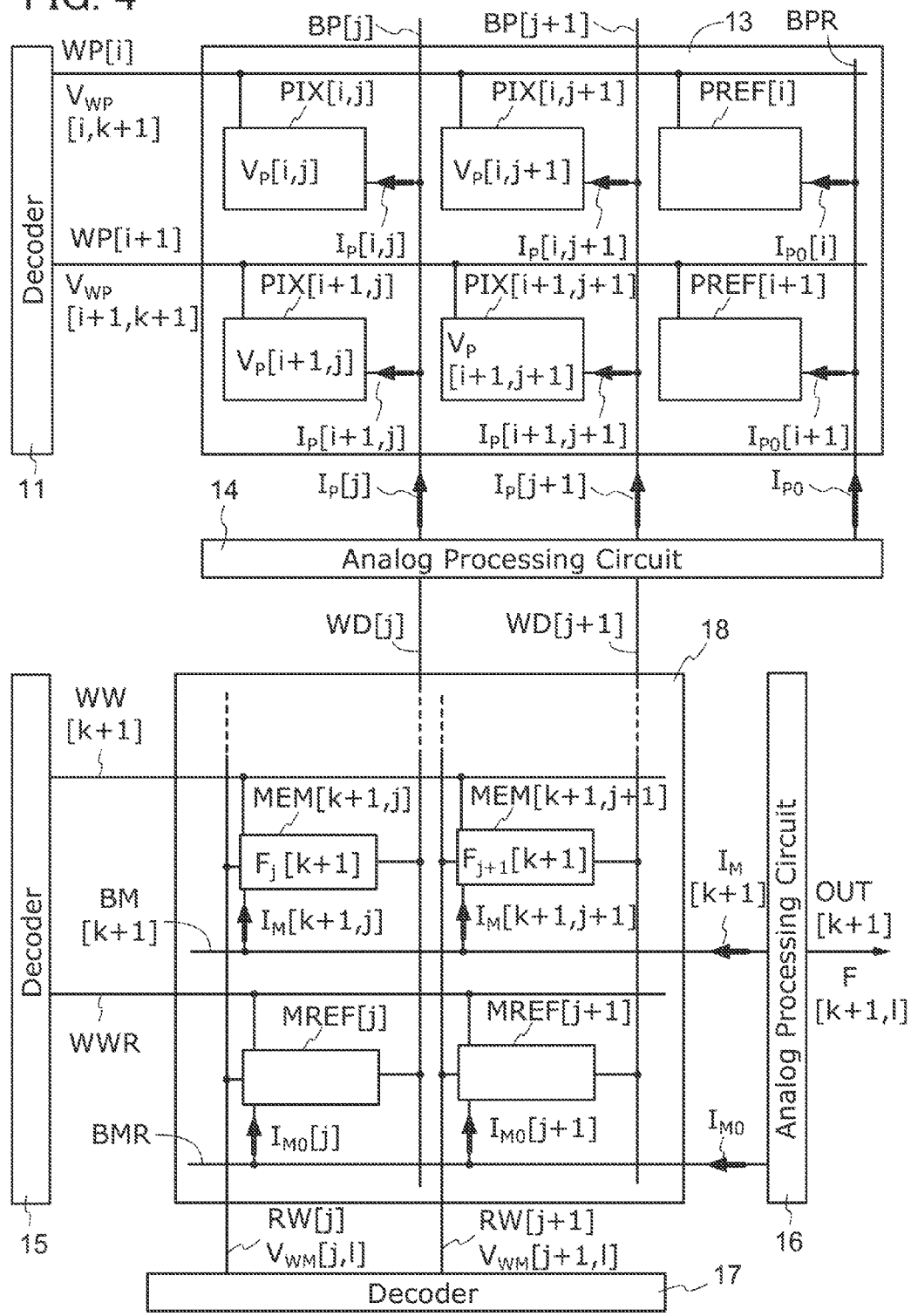

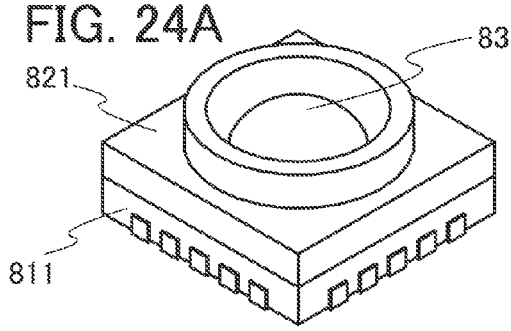
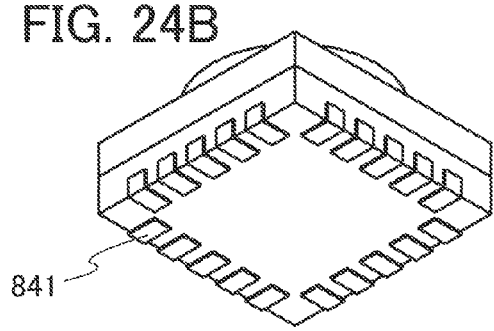
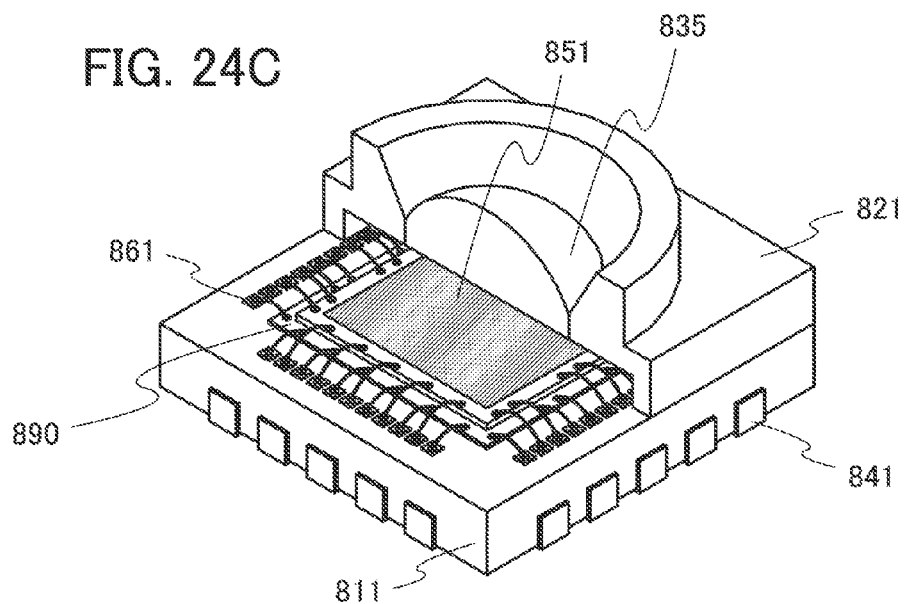
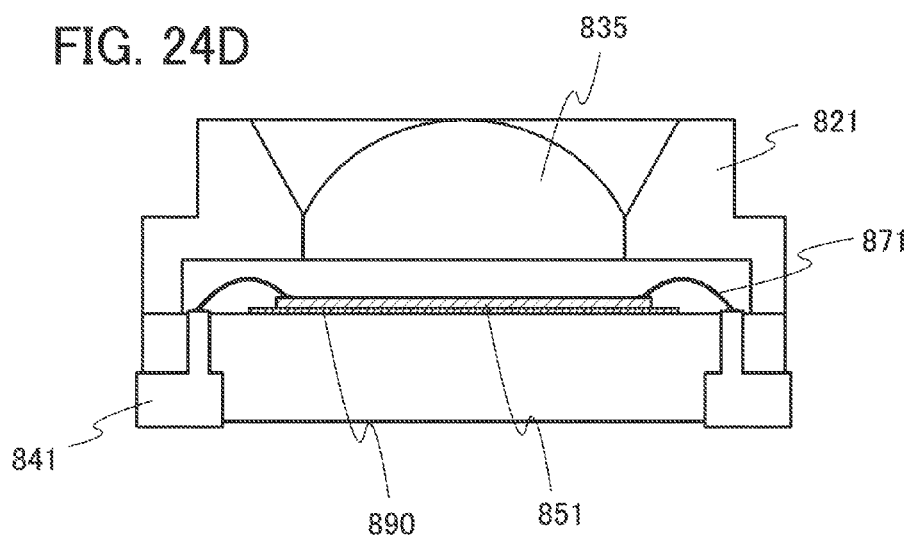

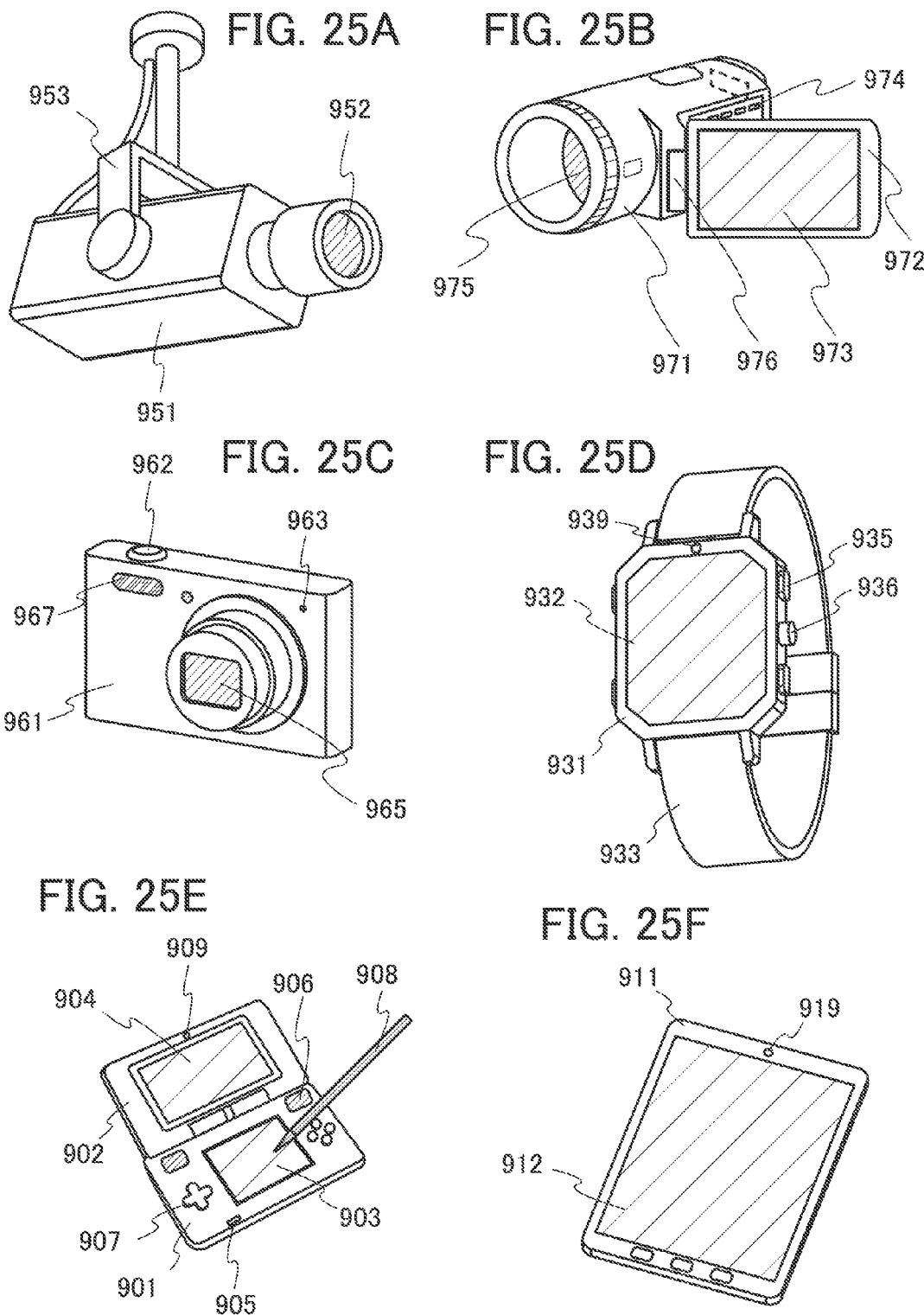

SEMICONDUCTOR DEVICE

BACKGROUND OF THE INVENTION

1. Field of the Invention

One embodiment of the present invention relates to a semiconductor device. Specifically, one embodiment of the present invention relates to a semiconductor device capable of obtaining and compressing imaging data.

In this specification and the like, the term "semiconductor device" generally means a device that can function by utilizing semiconductor characteristics. An imaging device, a display device, an electro-optical device, a semiconductor circuit, and an electronic device include a semiconductor device in some cases.

2. Description of the Related Art

Increases in the resolution and the number of pixels of a display device have been demanded; for example, an 8K ultra high definition television (UHD TV) with 7680 horizontal pixels by 4320 vertical pixels has been suggested. As the number of pixels increases, a size of the imaging data obtained by an imaging device also increases.

When an imaging data obtained by an imaging device is sent to other devices, the data is sent after being compressed, to reduce the data load in transmission. A typical data compression method in the case of motion image data includes an MPEG format. MPEG format utilizes discrete cosine transform on an imaging data in a referential frame which occurs every few frames, and in the frames between referential frames, discrete cosine transform is performed on the difference data between the imaging data of the referential frame and the imaging data of the frames between the referential frames.

A technique by which a transistor is formed using a semiconductor thin film formed over a substrate having an insulating surface has been attracting attention. The transistor is used in a wide range of electronic devices such as an integrated circuit (IC) and a display device. A silicon-based semiconductor is widely known as a semiconductor material that can be applied to the transistor, but an oxide semiconductor (OS) has been attracting attention as an alternative material. For example, a technique for forming a transistor using zinc oxide or an In—Ga—Zn-based oxide semiconductor as an oxide semiconductor is disclosed (see Patent Documents 1 and 2).

A transistor which includes an oxide semiconductor in a channel formation region (hereinafter referred to as an OS transistor) is known for its extremely low off-state current. Patent Document 3 discloses a technique in which a memory device is formed by using such off-state current characteristics. Patent Document 4 discloses an image sensor in which OS transistors are used.

REFERENCES

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-171702
[Patent Document 4] Japanese Published Patent Application No. 2013-042482

SUMMARY OF THE INVENTION

When the size of an imaging data is large, a large amount of time and power will be needed to compress the imaging data. Processes for compression of the imaging data include A/D conversion of the imaging data, output of the data after A/D conversion, storage of the output data into frame memory, processing of differences, and discrete cosine transform process, for example. The time and the power needed for A/D conversion of the imaging data and discrete cosine transform are particularly large.

An object of one embodiment of the present invention is to provide a semiconductor device capable of compressing data with a small amount of power. Another object of one embodiment of the present invention is to provide a semiconductor device capable of high-speed data compression.

Another object of one embodiment of the present invention is to provide a novel semiconductor device. Note that the description of a plurality of objects does not mutually preclude the existence. One embodiment of the present invention does not necessarily achieve all the objects listed above. Objects other than those listed above are apparent from the description of the specification, drawings, and claims, and such objects could also be an object of one embodiment of the present invention.

One embodiment of the present invention is a semiconductor device including a pixel portion, a memory, a first circuit and a second circuit. The pixel portion has a function of obtaining imaging data. The first circuit has a function of performing discrete cosine transform on the imaging data and generating first data. The first data is analog data. The memory has a function of storing the first data. The second circuit has a function of performing discrete cosine transform on the first data and generating second data.

In the embodiment described above, the pixel portion includes a photodiode and a transistor. The transistor preferably includes an oxide semiconductor in a channel formation region.

In the embodiment above, the memory includes a first transistor, a second transistor and a capacitor. The first transistor preferably includes an oxide semiconductor in a channel formation region. A channel formation region of the second transistor is preferably provided within a Si wafer.

One embodiment of the present invention is a semiconductor device including a pixel portion, a memory, a first circuit and a second circuit. The pixel portion has a function of obtaining a first to third imaging data. The third imaging data is a difference between the first imaging data and the second imaging data. The first circuit has a function of performing discrete cosine transform on the third imaging data and generating first data. The first data is analog data. The memory has a function of retaining the first data. The second circuit has a function of performing discrete cosine transform on the first data and generating second data.

In the embodiment described above, the pixel portion includes a photodiode and a transistor. The transistor preferably includes an oxide semiconductor in a channel formation region.

In the embodiment described above, the memory includes a first transistor, a second transistor, and a capacitor. The first transistor preferably includes an oxide semiconductor in a channel formation region. A channel formation region of the second transistor is preferably provided within the Si wafer.

One embodiment of the present invention is a camera module comprising a semiconductor device and a lens described in the embodiments above.

According to one embodiment of the present invention, a semiconductor device capable of compressing data with a small amount of power can be provided. Another embodiment of the present invention can provide a semiconductor device capable of high-speed data compression.

In one embodiment of the present invention, a novel semiconductor device can be provided. Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF THE DRAWINGS

In the accompanying drawings:

FIGS. 2A and 2B are flow charts which illustrate the process of performing discrete cosine transform on imaging data;

FIG. 4 is a circuit block diagram illustrating a configuration example of a semiconductor device;

FIGS. 24A to 24D are perspective views and a cross-sectional diagram illustrating a package containing an imaging device; and FIGS. 25A to 25F illustrate electronic devices.

DETAILED DESCRIPTION OF THE INVENTION

Figure 1:
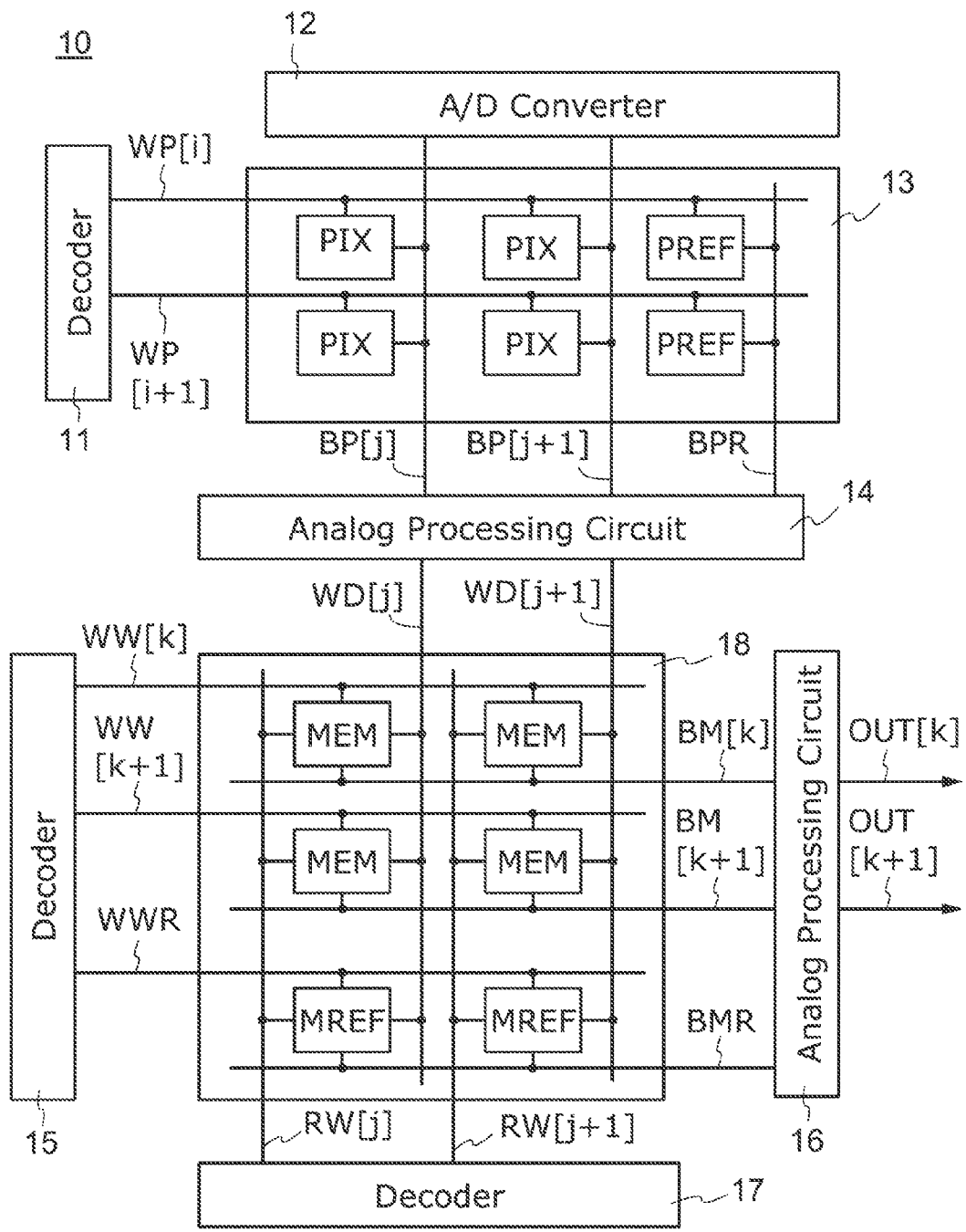
FIG. 1 is a circuit block diagram illustrating a configuration example of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Furthermore, in the present specification, any of the embodiments described below can be combined as appropriate. In addition, in the case where a plurality of structure examples are described in one embodiment, some of the structure examples can be combined as appropriate.

In the drawings, the size, the layer thickness, or the region is exaggerated for clarity in some cases. Therefore, the size, the layer thickness, or the region is not limited to the illustrated scale. Note that the drawings are schematic diagrams showing ideal examples, and embodiments of the present invention are not limited to shapes or values shown in the drawings.

Unless otherwise specified, on-state current in this specification refers to drain current of a transistor in an on state. Unless otherwise specified, the on state of an n-channel transistor means that the voltage difference between its gate and source ($V_{GS}$) is higher than or equal to the threshold voltage ($V_{th}$), and the on state of a p-channel transistor means that $V_{GS}$ is lower than or equal to $V_{th}$. For example, the on-state current of an n-channel transistor sometimes refers to a drain current that flows when $V_{GS}$ is higher than or equal to $V_{th}$. The on-state current of a transistor depends on voltage ($V_{DS}$) between its drain and source in some cases.

Unless otherwise specified, an off-state current in this specification refers to a drain current of a transistor in an off state. Unless otherwise specified, the off state of an n-channel transistor means that $V_{GS}$ is lower than $V_{th}$, and the off state of a p-channel transistor means that $V_{GS}$ is higher than $V_{th}$. For example, the off-state current of an n-channel transistor sometimes refers to a drain current that flows when $V_{GS}$ is lower than $V_{th}$. The off-state current of a transistor depends on $V_{GS}$ in some cases. Thus, "the off-state current of a transistor is lower than $10^{-21}$ A" sometimes means that there is $V_{GS}$ at which the off-state current of a transistor is lower than $10^{-21}$ A.

The off-state current of a transistor depends on $V_{DS}$ in some cases. Unless otherwise specified, the off-state current in this specification may be an off-state current at $V_{DS}$ with an absolute value of 0.1 V, 0.8 V, 1 V, 1.2 V, 1.8 V, 2.5 V, 3 V, 3.3 V, 10 V, 12 V, 16 V, or 20 V. Alternatively, in some cases, the off-state current is $V_{DS}$ used in the semiconductor device or the like including the transistor.

Note that in this specification, a high power supply voltage and a low power supply voltage are sometimes referred to as an H level (or $V_{DD}$) and an L level (or GND), respectively.

Embodiment 1

Configuration Example of Semiconductor Device

FIG. 1 shows a configuration example of a semiconductor device 10 which is one embodiment of the present invention.

The semiconductor device 10 includes a decoder 11, an A/D converter 12, a pixel portion 13, an analog processing circuit 14, a decoder 15, an analog processing circuit 16, a decoder 17, and a memory cell array 18.

The pixel portion 13 includes a plurality of pixels PIX arranged in a matrix, and a plurality of referential pixels PREF. The pixels PIX and the referential pixels PREF are connected to the decoder 11 through a wiring WP. Furthermore, the pixel PIX is electrically connected to the A/D converter 12 and the analog processing circuit 14 through a wiring BP. The referential pixel PREF is electrically connected to the analog processing circuit 14 through a wiring BPR.

In the following sections, the pixel PIX which is connected to a wiring WP[i] and a wiring BP[j] will be referred to as the pixel PIX[i, j], and the referential pixel PREF which is connected to a wiring WP[i] will be referred as the referential pixel PREF[i]. Furthermore, i is an integer that is larger than or equal to 0 and smaller than or equal to $i_{MAX}$. Similarly, j is an integer that is larger than or equal to 0, and smaller than or equal to $j_{MAX}$.

The pixel PIX preferably includes a light-receiving element such as a photodiode. When the pixel PIX includes a light-receiving element, the pixel portion 13 functions as an imaging element, and is capable of obtaining imaging data.

The memory cell array 18 includes a plurality of memory cells MEM arranged in a matrix, and a plurality of referential memory cells MREF. The memory cell MEM is electrically connected to the decoder 15 through a wiring WW. The memory cell MEM is electrically connected to the decoder 17 through a wiring RW. The memory cell MEM is electrically connected to the analog processing circuit 16 through the wiring BM. The referential memory cell MREF is electrically connected to the decoder 15 through a wiring WWR. The referential memory cell MREF is electrically connected to the decoder 17 through the wiring RW. The referential memory cell MREF is electrically connected to the analog processing circuit 16 through a wiring BMR.

In the following description, the memory cell MEM that are connected to wirings WW[k] and RW[j] will be referred to as the memory cell MEM[k, j], and the referential memory cell MREF that is connected to a wiring RW[j] will be referred to as the referential memory cell MREF[j]. Note that k is an integer greater than or equal to 0.

The number of wirings WW is preferably the same as the number of wirings WP.

In FIG. 1, pixels PIX and memory cells MEM are drawn as being arranged in a matrix of two columns and two rows; note that the matrix of pixels PIX and memory cells MEM is not limited to this number of columns and rows, and pixels PIX and memory cells MEM can be treated as a matrix with any given number of columns and rows.

The semiconductor device 10 can perform A/D conversion on the imaging data obtained by the pixel portion 13 with the A/D converter 12. The semiconductor device 10 can also perform discrete cosine transform and compression on the imaging data. However, A/D conversion often takes a large amount of power and time. The semiconductor device 10 according to one embodiment of the present invention can perform discrete cosine transform on the imaging data without performing the A/D conversion. In the following sections, a method of performing discrete cosine transform on imaging data without putting the imaging data through the A/D converter 12 will be described with reference to FIGS. 2A and 2B, FIG. 3, and FIG. 4.

FIGS. 2A and 2B show flow charts detailing the use of the semiconductor device 10 in the discrete cosine transform performed on image data.

First, FIG. 2A is described. The pixel portion 13 obtains imaging data, then outputs the imaging data as data 41. Next, the analog processing circuit 14 performs a one-dimensional discrete cosine transform in the x-axis direction on the data 41, then outputs data 42. The data 42 is temporarily stored in the memory cell array 18. The memory cell array 18 outputs the stored data as data 43. The analog processing circuit 16 performs a one-dimensional discrete cosine transform in the y-axis direction on the data 43, then outputs data 44. As a result, the data 44 corresponds to imaging data on which a two-dimensional discrete cosine transform in the x-axis and y-axis directions has been performed. By subsequently performing an encoding operation and the like on the data 44 after D/A conversion, compressed data that is compatible with MPEG format and the like can be obtained. Furthermore, in FIG. 2A, the analog processing circuit 14 may perform the one-dimensional discrete cosine transform in the y-axis direction, and the analog processing circuit 16 may perform the one-dimensional discrete cosine transform in the x-axis direction.

Next, FIG. 2B is described. The pixel portion 13 obtains first imaging data, and then obtains second imaging data after a certain amount of time has passed. A difference (difference data) of the first imaging data and the second imaging data is obtained, and the difference data is output as data 45. Next, the analog processing circuit 14 performs the one-dimensional discrete cosine transform in the x-axis direction on the data 45, and then outputs data 46. The data 46 is temporarily stored in the memory cell array 18. The memory cell array 18 outputs the stored data as data 47. The analog processing circuit 16 performs the one-dimensional discrete cosine transform in the y-axis direction on the data 47, and outputs it as data 48. As a result, the data 48 corresponds to a difference data on which a two-dimensional discrete cosine transform in the x-axis and y-axis directions has been performed. By subsequently performing an encoding operation and the like on the data 48 after D/A conversion, compressed data that is compatible with MPEG format and the like can be obtained. Furthermore, in FIG. 2B, the analog processing circuit 14 may perform the one-dimensional discrete cosine transform in the y-axis direction, and the analog processing circuit 16 may perform the one-dimensional discrete cosine transform in the x-axis direction.

When the time difference between time when the first imaging data was obtained and time when the second imaging data was obtained is short, the difference in the first and second imaging data is small, and the difference data is often 0. Therefore, the size of the data 48 can be smaller than that of the data 44.

The discrete cosine transform will be described in detail with reference to the circuit block diagram in FIG. 3.

First, a beam of light enters the pixel portion 13; then, a photodiode included in the pixel PIX[i, j] receives the light. The pixel PIX[i, j] generates and stores imaging data that includes a potential $V_P[i, j]$. In the same manner, the other pixels PIX generate and store imaging data that includes a potential $V_P$.

The circuit configuration of the referential pixel PREF is preferably the same as that of the pixel PIX. Furthermore, a photodiode included in the referential pixel PREF preferably is shielded from light so that the photodiode does not receive any light.

The decoder 11 has a function of supplying data including a potential $V_{WP}[i, k]$ to a plurality of pixels PIX and the referential pixel PREF[i] that are connected to the wiring WP[i]. Similarly, the decoder 11 has a function of supplying data including a potential $V_{WP}[i+1, k]$ to a plurality of pixels PIX and the referential pixel PREF[i+1] that are connected to a wiring WP[i+1].

The pixel PIX[i,j] has a function of sending a current $I_P[i,j]$ to the wiring BP[j] depending on the imaging data ($V_P[i, j]$) and the data ($V_{WP}[i, k]$) supplied from the decoder 11. Similarly, the pixel PIX[i+1,j] has a function of sending a current $I_P[i+1, j]$ to the wiring BP[j] depending on the imaging data ($V_P[i+1,j]$) and the data ($V_{WP}[i+1, k]$) supplied by the decoder 11. As a result, a current $I_P[j]$ that is expressed as in Formula (1) flows across the wiring BP[j].

$$I_P[j] = \sum_{i=0}^{i_{MAX}} I_P[i, j] \tag{1}$$

The referential pixel PREF[i] has a function of sending a current $I_{P0}[i]$ to the wiring BPR, depending on the data ($V_{WP}[i, k]$) supplied by the decoder 11. Similarly, the referential pixel PREF[i+1] has a function of sending a current $I_{P0}[i+1]$ to the wiring BRP depending on the data ($V_{WP}[i, k]$) supplied by the decoder 11. As a result, a current $I_{P0}$ that is expressed as in Formula (2) flows across the wiring BRP.

$$I_{P0} = \sum_{i=0}^{i_{MAX}} I_{P0}[i] \tag{2}$$

The analog processing circuit 14 has a function of generating data which includes a potential $F_j[k]$ from the current $I_P[j]$ and the current $I_{P0}$, then supplying the data to the wiring WD[j]. Here, $F_j[k]$ is a potential expressed as in Formula (3). In Formula (3), α1 represents a coefficient.

$$F_j[k] = \alpha_1 \sum_{i=0}^{i_{MAX}} V_{WP}[i, k] V_P[i, j] \tag{3}$$

When $V_{WP}[i, k]$ is set to satisfy Formula (4) below, $F_j[k]$ corresponds to a conversion factor which is obtained by performing a one-dimensional discrete cosine transform in the x-axis direction on $V_P[i, j]$. In Formula (4), C[k] corresponds to the coefficient shown in Formula (5).

$$F_j[k] = \alpha_1 \sum_{i=0}^{i_{MAX}} V_{WP}[i, k] V_P[i, j] = \frac{C[k]}{2} \sum_{i=0}^{i_{MAX}} V_P[i, j] \cos\left[\frac{(2i+1)k\pi}{2(i_{MAX}+1)}\right] \tag{4}$$

$$C[n] = \begin{cases} 1/\sqrt{2} & (n=0) \\ 1 & (n \neq 0) \end{cases} \tag{5}$$

Similarly, the analog processing circuit 14 has a function of generating data that includes a potential $F_{j+1}[k]$ from the current $I_P[j+1]$ and the current $I_{p0}$, then supplying the data to a wiring WD[j+1].

The memory cell MEM has a function of retaining the data supplied by the analog processing circuit 14. Furthermore, the decoder 15 has a function of selecting a memory cell MEM in which the data is to be retained. For example, when data including $F_j[k]$ and $F_{j+1}[k]$ are supplied to wirings WD[i] and WD[j+1], respectively, the decoder 15 will supply a selection signal to the wiring WW[k]. Memory cells MEM[k, j] and MEM[k, j+1] selected by the decoder 15 retain data that includes $F_j[k]$ and $F_{j+1}[k]$, respectively.

The referential memory cell MREF preferably includes the same circuit configuration as that of the memory cell MEM.

The decoder 17 has a function of supplying data that includes the potential $V_{WM}[j, 1]$ to a plurality of memory cells MEM and the referential memory cell MREF[j] that are connected to the wiring RW[i]. Note that 1 is an integer greater than or equal to 0. Similarly, the decoder 17 has a function of supplying data that includes the potential $V_{WM}[j+1, 1]$ to a plurality of memory cells MEM and the referential memory cell MREF[j+1] that are connected to a wiring RW[j+1].

The memory cell MEM[k, j] has a function of sending a current $I_M[k, j]$ to the wiring BM[k], depending on the data being retained in the memory cell MEM[k, j]($F_j[k]$), and the data ($V_{WM}[j, 1]$) supplied by the decoder 11. Similarly, the memory cell MEM[k, j+1] has a function of sending a current $I_M[k, j+1]$ to the wiring BM[k], depending on the data being retained in the memory cell MEM[k, j+1] ($F_{j+1}[k]$), and the data ($V_{WM}[j+1, 1]$) supplied by the decoder 17. As a result, a current $I_M[k]$ that is expressed as in Formula (6) flows across the wiring BM[k].

$$I_M[k] = \sum_{j=0}^{j_{MAX}} I_M[k, j] \tag{6}$$

The referential memory cell MREF[j] has a function of sending a current $I_{M0}[j]$ to the wiring BMR, depending on the data ($V_{WM}[j, 1]$) supplied by the decoder 17. Similarly, the referential memory cell MREF[/+1] has a function of sending a current $I_{M0}[j+1]$ to the wiring BMR, depending on the data ($V_{WM}[j+1, 1]$) supplied by the decoder 17. As a result, a current $I_{M0}$ expressed as in Formula (7) flows across the wiring BMR.

$$I_{M0} = \sum_{j=0}^{j_{MAX}} I_{M0}[j] \tag{7}$$

The analog processing circuit 16 has a function of generating data which includes a potential F[k, l] expressed as in Formula (8) from currents $I_M[k]$ and $I_{M0}$, then supplying the generated data to a wiring OUT[k]. In Formula (8), α2 represents a coefficient.

$$F[k, l] = \alpha_2 \sum_{j=0}^{j_{MAX}} V_{WM}[j, l] F_j[k] \tag{8}$$

By providing potentials $V_{WP}[i, k+1]$ and $V_{WP}[i+1, k+1]$ to wirings WP[i] and WP[i+1] (illustrated in FIG. 3) respectively, data including potentials $F_j[k+1]$ and $F_{j+1}[k+1]$ will be stored in memory cells MEM[k+1,j] and MEM[k+1, j+1], respectively. FIG. 4 shows the circuit block diagram illustrating this case. The memory cells MEM connected to a wiring BM[k+1] have a function of sending a current $I_M[k+1]$ to the wiring BM[k+1]. As a result, the analog processing circuit 16 can generate data which includes a potential F[k+1, l] from currents $I_M[k+1]$ and $I_{M0}$, and supply the data to a wiring OUT[k+1].

When $V_{WM}[j, l]$ is set to satisfy Formula (9) below, F[k, l] corresponds to a conversion factor which is obtained by performing a one-dimensional discrete cosine transform in the y-axis direction on F[k].

$$F[k, l] = \alpha_2 \sum_{j=0}^{j_{MAX}} V_{WM}[j, l] F_j[k] = \frac{C[l]}{2} \sum_{j=0}^{j_{MAX}} F_j[k] \cos\left[\frac{(2j+1)l\pi}{2(j_{MAX}+1)}\right] \quad (9)$$

The semiconductor device 10 can execute the discrete cosine transform in any given number of rows and columns. For example, in the case where the discrete cosine transform is performed on an 8×8 matrix, $i_{MAX}$ and $j_{MAX}$ are given as $i_{MAX}=7$ and $j_{MAX}=7$, and sequential application of a desired potential to eight of the wirings WP and sequential application of a desired potential to eight of the wirings RW are repeated. In this case, eight rows of memory cells MEM enable a two-dimensional discrete cosine transform.

Figure 3:
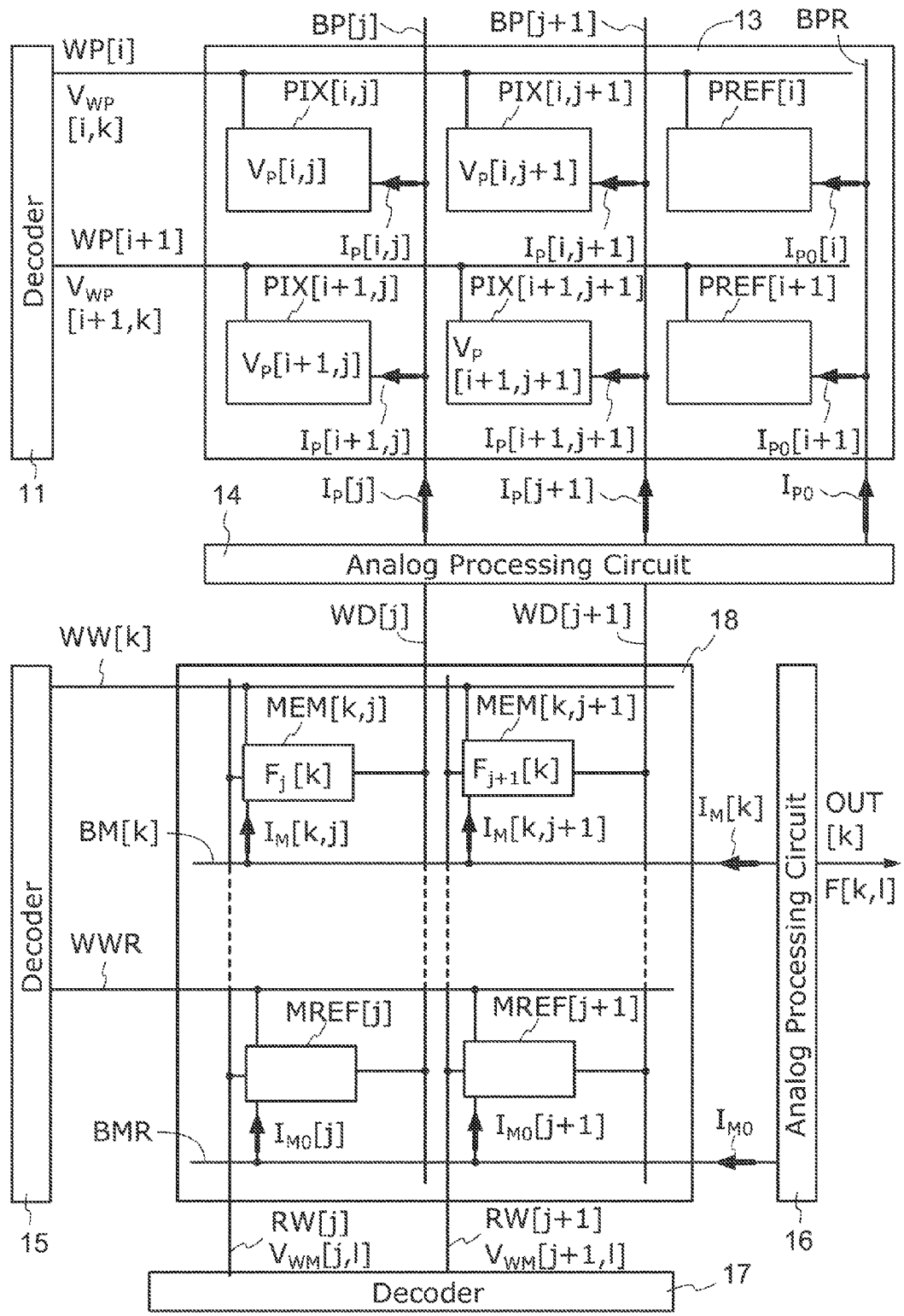
FIG. 3 is a circuit block diagram illustrating a configuration example of a semiconductor device.

In FIG. 3, $V_P[i,j]$, $V_P[i,j+1]$, $V_P[i+1,j]$, $V_P[i+1,j+1]$ and the like correspond to the imaging data in FIG. 2A. $I_P[j]$, $I_P[j+1]$ and the like correspond to the data 41 in FIG. 2A. $F_j[k]$, $F_{j+1}[k]$ and the like correspond to the data 42 in FIG. 2A. $I_M[k]$ and the like correspond to the data 43 in FIG. 2A. F[k, l] and the like correspond to the data 44 in FIG. 2A.

Note that the difference data shown in FIG. 2B refers to the difference data between the first imaging data ($V_{P1}$) and the second imaging data ($V_2$), which is $V_{P2}-V_{P1}$. When the imaging data ($V_P$) is replaced with the difference data ($V_{P2}-V_{P1}$), FIG. 2A corresponds to FIG. 2B.

From the above, the semiconductor device 10 has a function of performing discrete cosine transform on the imaging data obtained by the pixel portion 13, then outputting the data from the analog processing circuit 16. The data that has been subjected to the discrete cosine transform is compressed, then is sent to receiver devices, of a television or the like.

The semiconductor device 10 above can perform discrete cosine transform directly on analog imaging data, without A/D conversion. Thus, the semiconductor device 10 can compress data with a small amount of power. Furthermore, the semiconductor device 10 can compress data rapidly.

Next, the details of the components that constitute the semiconductor device 10 are described in detail.

<Imaging Element>

Figure 5A:
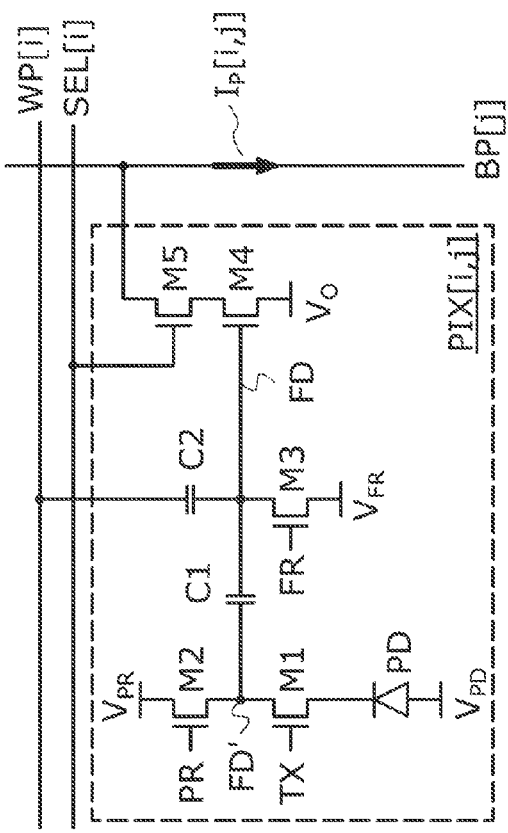
FIG. 5A is a circuit diagram illustrating a configuration example of a pixel.

FIG. 5A is a circuit diagram which shows an example of the pixel PIX[i, j]. The pixel PIX[i, j] includes transistors M1 to M5, capacitors C1 and C2, and a photodiode PD. Furthermore, the pixel PIX[i,j] is electrically connected to the wiring WP[i], a wiring SEL[i], the wiring BP[j], a wiring TX, a wiring PR and a wiring FR.

The wiring WP[i] is electrically connected to a first terminal of the capacitor C2. The wiring SEL[i] is electrically connected to a gate of the transistor M5. The wiring BP[j] is electrically connected to a first terminal of the transistor M5. The wiring TX is electrically connected to a gate of the transistor M1. The wiring PR is electrically connected to a gate of the transistor M2. The wiring FR is electrically connected to a gate of the transistor M3.

A potential $V_{PR}$ is supplied to a first terminal of the transistor M2, and the second terminal of the transistor M2 is electrically connected to a first terminal of the transistor M1 and a first terminal of the capacitor C1.

A first terminal of the photodiode PD is electrically connected to a second terminal of the transistor M1, and a second terminal of the photodiode PD is supplied with a potential $V_{PD}$.

A first terminal of the transistor M3 is electrically connected to a second terminal of the capacitor C1, a second terminal of the capacitor C2 and a gate of the transistor M4. A second terminal of the transistor M3 is supplied with a potential $V_{FR}$.

A first terminal of the transistor M4 is electrically connected to a second terminal of the transistor M5; a second terminal of the transistor M4 is supplied with a potential $V_O$.

A node of the first terminal of the transistor M3, the second terminal of the capacitor C1, the second terminal of the capacitor C2, and the gate of the transistor M4 is referred to as a node FD. Furthermore, the node of the first terminal of the transistor M1 and the second terminal of the transistor M2 is referred to as a node FD'.

The wiring WP[i], the wiring SEL[i], the wiring TX, the wiring PR and the wiring FR have the function of supplying control signals. A current corresponding to imaging data is output to a wiring BP[j].

The node FD has a function of accumulating a charge that corresponds to imaging data.

The capacitance value of the capacitor C1 is preferably larger than that of the capacitor C2.

Next, the operation of the pixel PIX[i, j] is described with reference to the timing chart in FIG. 5B. Note that in the following description, transistors M1 to M5 are assumed as n-channel transistors.

Figure 5B:
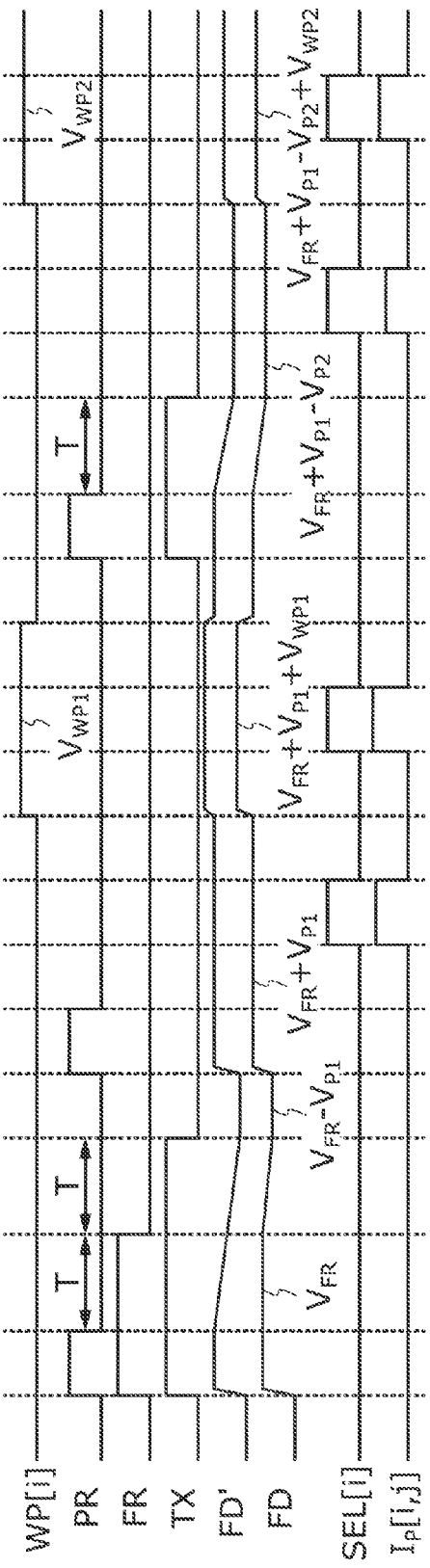
FIG. 5B is a timing chart illustrating an operation example of a pixel.

FIG. 5B is a timing chart that describes the operation of the pixel PIX[i, j]. Here, $V_{PD}$ is set at a low power source potential, $V_{PR}$ is set at a high power source potential, $V_{FR}$ is set at a high power source potential, and $V_O$ is set at a low power source potential. Furthermore, the potential of the wiring WP[i] is set at a given standard potential.

Note that the timing chart shown in FIG. 5B illustrates the operation where the pixel PIX[i, j] obtains the first imaging data and the second imaging data, and then generates the difference data; this corresponds to an operation illustrated in FIG. 2B. If the difference data is unnecessary, as illustrated in FIG. 2A, the operation for obtaining the second imaging data may be omitted. Specifically, the operation after a time T12 may be omitted.

Times T1 to T4 correspond to a period for obtaining the first imaging data by receiving light. In times T1 to T2, the wiring PR is set at an H level, the wiring FR is set at an H level, and the wiring TX is set at an H level. In this period, the potential of the node FD is set at the potential $V_{FR}$, and the potential of the node FD' is set at the potential $V_{PR}$.

In times T2 to T3, the wiring PR is set at an L level, the wiring FR is set at an H level, and the wiring TX is set at an H level. In this period, the potential of the node FD' is reduced by $V_{P1}$, depending on the amount of light received by the photodiode PD; the potential of the node FD' is thus reduced to $V_{PR}-V_{P1}$. An increase in the intensity of light with which the photodiode PD is irradiated reduces the potential of the node FD'. Note that the potential of the node FD remains unchanged at $V_{FR}$.

In times T3 to T4, the wiring PR is set at an L level, the wiring FR is set at an L level, and the wiring TX is set at an H level. In this period, the potential of the node FD' is further reduced by $V_{P1}$, depending on the amount of light received by the photodiode PD; the potential of the node FD' is thus reduced to $V_{PR}-2V_{P1}$. By capacitive coupling between the capacitor C1 and the capacitor C2, the potential of the node FD is reduced by $V_{P1}$, reducing the potential of the node FD to $V_{FR}$-$V_{P1}$. Note that an increase in the intensity of light with which the photodiode PD is irradiated reduces the potential of the node FD'. Furthermore, the potential of the node FD is also reduced. Note that the period from Time T2 to Time T3 and the period from Time T3 to Time T4 are made to have the same length and each correspond to a period T.

Times T5 to T12 correspond to a period in which a first current is obtained; the first current depends on the potential of the first imaging data and the potential applied to the wiring WP[i]. In times T5 to T6, the wiring PR is set at an H level, the wiring FR is set at an L level, and the wiring TX is set at an H level. In this period, the potential of the node FD' is set from $V_{PR}$-$2V_{P1}$, to $V_{PR}$. That is, the potential of the node FD' increases as much as the amount of voltage decrease ($2V_{P'}$) in times T2 to T4. Meanwhile, the potential of the node FD increases from $V_{FR}$-$V_{P1}$ by $2V_1$ owing to capacitive coupling between the capacitor C1 and the capacitor C2. That is, the potential of the node FD will be $V_{FR}$+$V_{P1}$, which is a potential obtained by adding the amount of voltage decrease in times T3 and T4 to $V_{FR}$.

In times T7 to T8, the wiring SEL is set at an H level. In this period, a current corresponding to imaging data flows across the wiring BP[j], depending on the potential of the node FD, which is at $V_{FR}$+$V_{P1}$. This amounts to the obtaining of the offset current, which will be described later.

In times T9 to T12, the potential of the wiring WP is at $V_{WP1}$. Here, $V_{WP1}$ is defined as the amount of voltage increase from the given standard voltage described above. In this period, the potential of the node FD is set at $V_{FR}$+$V_{P1}$+$V_{WP1}$. Note that the potential of the wiring WP[i] is superimposed on the potential of the node FD through the capacitor C2; therefore, the potential change in the wiring WP[i] does not directly correspond to the potential increase of the node FD. More specifically, the amount of potential increase at the node FD is obtained by multiplying the amount of potential change in the wiring WP[i] with a capacitive coupling coefficient, which can be calculated from the capacitance of the capacitor C1, the capacitance of the capacitor C2, the gate capacitance of the transistor M4, and a parasitic capacitance. Here, for simplicity, a potential obtained by multiplication of the capacitive coupling coefficient is represented as $V_{WP1}$; a potential actually supplied to the wiring WP[i] may be converted as appropriate using the capacitive coupling coefficient.

In times T10 to T11, the wiring SEL is set at an H level. In this period, a first current corresponding to the first imaging data flows across the wiring BP[j], depending on the potential of the node FD, which is at $V_{FR}$+$V_{P1}$+$V_{WP1}$.

The times T13 to T20 is a period in which difference data between the first imaging data and the second imaging data is obtained.

In times T13 to T14, the wiring PR is at set at an H level, the wiring FR is set at an L level, and the wiring TX is set at an H level. In this period, the potential of the node FD' is set at the potential $V_{PR}$. Meanwhile, the potential of the node FD is set at $V_{FR}$+$V_{P1}$.

In times T14 to T15, the wiring PR is set at an L level, the wiring FR is set at an L level, and the wiring TX is set at an H level. In this period, the potential of the node FD' decreases by $V_{P2}'$, depending on the light with which the photodiode PD is irradiated; furthermore, by capacitive coupling between the capacitor C1 and the capacitor C2, the potential of the node FD decreases by $V_{P2}$, which reduces the potential of the node FD to $V_{FR}$+$V_{P1}$-$V_2$. Furthermore, the duration of time between time T14 and time T15 is given as T.

When the light with which the photodiode PD is irradiated is more intense in this period than that during times T2 and T4, the voltage decrease ($V_{P2}$) of the node FD in times T14 to T15 is greater than the voltage decrease ($V_{P1}$) of the node FD in the times T3 to T4. As a result, the potential of the node FD ($V_{FR}$+$V_{P1}$-$V_{P2}$) is lower than the potential $V_{FR}$, which indicates that the difference between the first imaging data and the second imaging data is negative.

Similarly, when the light with which the photodiode PD is irradiated is less intense in this period than that during times T2 to T4, the voltage decrease ($V_{P2}$) of the node FD in times T14 to T15 is smaller than the voltage decrease ($V_{P1}$) of the node FD in times T3 to T4. As a result, the potential of the node FD ($V_{FR}$+$V_{P1}$-$V_{P2}$) is higher than the potential V, which indicates that the difference between the first imaging data and the second imaging data is positive.

Similarly, when the light with which the photodiode PD is irradiated in this period has the same intensity as irradiation light during times T2 to T4, the voltage decrease ($V_{P2}$) of the node FD in times T14 to T15 is the same as the voltage decrease ($V_{P1}$) of the node FD in times T3 to T4. As a result, the potential of the node FD ($V_{FR}$+$V_{P1}$-$V_{P2}$) is the same as the potential $V_{FR}$, which indicates that there is no difference between the first imaging data and the second imaging data.

In times T16 to T17, the wiring SEL is set at an H level. In this period, a current corresponding to the imaging data flows across the wiring BP[j] depending on the potential of the node FD, which is at $V_{FR}$+$V_{P1}$-$V_{P2}$. This amounts to the obtaining of the offset current, which will be described later.

In times T18 to T20, a potential of the wiring WP[i] is set at $V_{WP2}$. Here, $V_{WP2}$ is defined as an amount of voltage increase from the standard potential described above. In this period, the potential of the node FD is set at $V_{FR}$+$V_{P1}$-$V_{P2}$+$V_{WP2}$. Note that the potential change of the wiring WP[i] is directly reflected as the potential increase of the node FD, in the same manner as in times T9 to T12.

In times T19 to T20, the wiring SEL is set at an H level. In this period, a second current flows across the wiring BP[j] depending on the potential of the node FD, which is at $V_{FR}$+$V_{P1}$-$V_{P2}$+$V_{WP2}$.

By performing the operation above for other pixels PIX, currents $I_P$[j], $I_P$[j+1], and the like shown in FIG. 3 can be obtained.

By performing the operation above for referential pixels PREF and the like, current $I_{P0}$ shown in FIG. 3 can be obtained. Note that referential pixels PREF are always shielded from light; the operation described above can be understood when $V_{P1}$=$V_{P2}$=0 is assumed in the description of FIG. 5B.

It is known by experience that the difference between the first imaging data and the second imaging data described above is small. Thus, the difference data obtained in times T13 to T20 is zero in many cases. Therefore, the semiconductor device 10 can further reduce the size of the imaging data by performing discrete cosine transform on the difference data described above.

Note that the semiconductor device 10 preferably obtains imaging data at once from multiple pixels. That is, the semiconductor device 10 preferably takes images using a global shutter method. To enable this configuration, transistors included in the pixel PIX such as the transistor M1, the transistor M2 and the transistor M3 preferably are transistors with a low off-state current, such as OS transistors, or transistors with wide-bandgap semiconductor materials included in the channel formation region. Note that in this specification, the term "wide-bandgap semiconductor material" is a semiconductor material whose bandgap is 2.2 eV or greater. Examples of the wide-bandgap semiconductor materials include silicon carbide, gallium nitride, and diamond.

<Circuit Configuration of the First Analog Processing Circuit>

Figure 6:
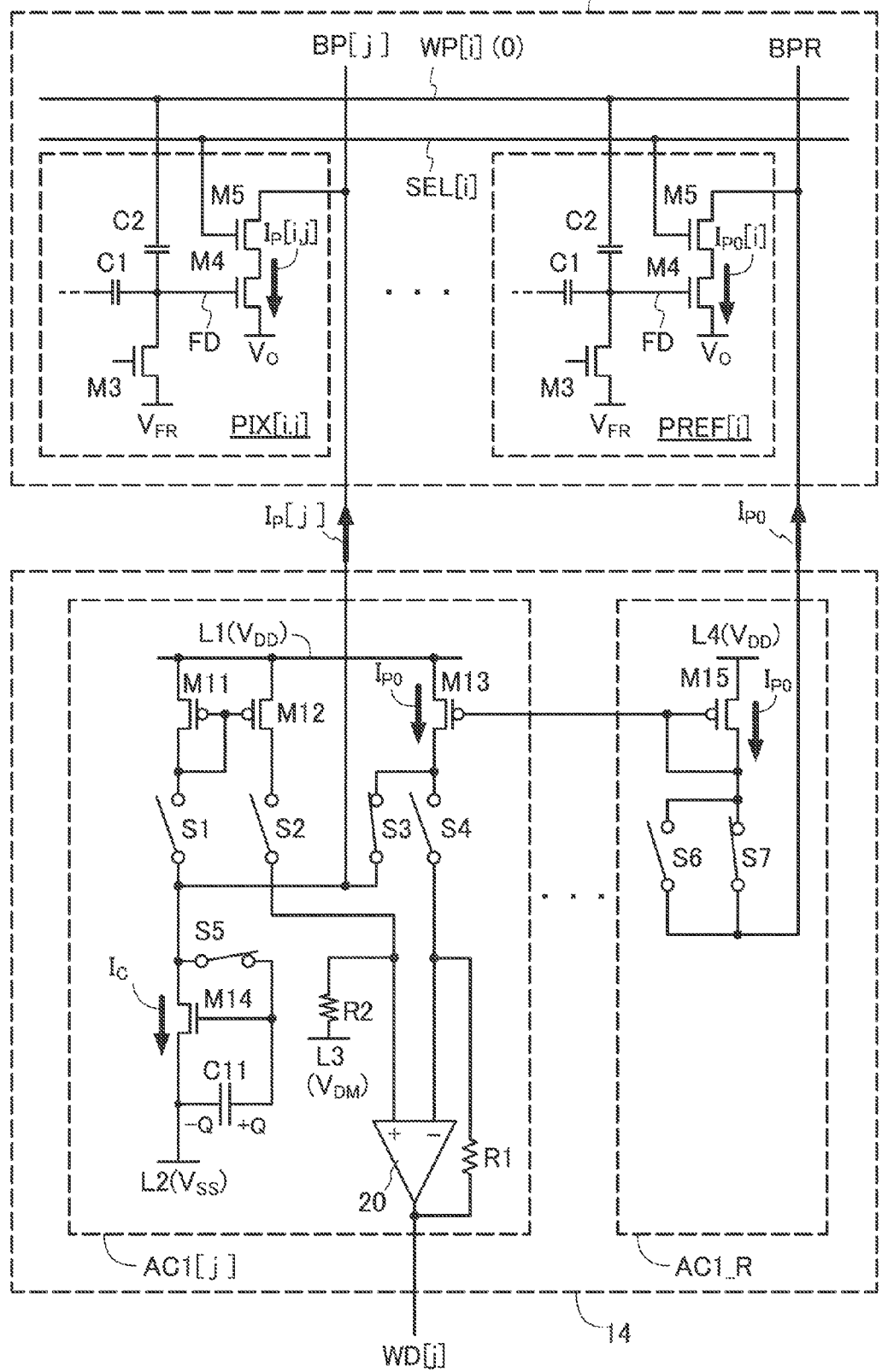
FIG. 6 is a circuit diagram illustrating a configuration example of a pixel portion and an analog processing circuit.

FIG. 6 illustrates a circuit configuration example of the pixel portion 13 and the analog processing circuit 14. The pixel portion 13 includes a plurality of pixels PIX arranged in a matrix, and a plurality of referential pixels PREF. FIG. 6 shows the pixel PIX[i, j] and the referential pixel PREF[i] from the plurality of pixels PIX and the plurality of referential pixels PREF. Circuit configurations of the pixel PIX[i, j] and the referential pixel PREF[i] are identical to those illustrated in FIG. 5A, though some parts have been omitted.

The analog processing circuit 14 includes a plurality of circuits AC1 and a circuit AC1_R. From the circuits described above, FIG. 6 illustrates a circuit AC1[U] and the circuit AC1_R.

The circuit AC1[i] includes switches S1 to S5, transistors M11 to M14, a capacitor C11, an operational amplifier 20, a resistor R1, a resistor R2, and wirings L1 to L3. Furthermore, the circuit AC1[j] is electrically connected to the pixel PIX[i, j] through the wiring BP[j], and the circuit AC1_R is electrically connected to the referential pixel PREF[i] through a wiring BPR.

In the circuit AC1[i], a first terminal of the transistor M11, a first terminal of the transistor M12 and a first terminal of the transistor M13 are electrically connected to the wiring L1. A first terminal of the transistor M14 is electrically connected to the wiring BP[j], and a second terminal of the transistor M14 is electrically connected to the wiring L2.

A gate of the transistor M11 and a gate of the transistor M12 are electrically connected to a second terminal of the transistor M11.

The switch S1 has a function of controlling the electrical connection between the wiring BP[j] and the second terminal of the transistor M11. The switch S2 has a function of controlling the electrical connection between the non-inverting input terminal of the operational amplifier 20 and a second terminal of the transistor M12. The switch S3 has a function of controlling the electrical connection between the wiring BP[j] and the second terminal of the transistor M13. The switch S4 has a function of controlling the electrical connection between the inverting input terminal of the operational amplifier 20 and a second terminal of the transistor M13. The switch S5 has a function of controlling the electrical connection between the first terminal of the transistor M14 and a gate of the transistor M14.

The inverting input terminal of the operational amplifier 20 is electrically connected to an output terminal of the operational amplifier 20 through the resistor R1, and the non-inverting input terminal of the operational amplifier 20 is electrically connected to the wiring L3 through the resistor R2.

A first terminal of the capacitor C11 is electrically connected to a gate of the transistor M14, and a second terminal of the capacitor C11 is electrically connected to the second terminal of the transistor M14 and the wiring L2.

The circuit AC1_R includes switches S6 and S7, a transistor M15, and a wiring L4.

In the circuit AC1_R, a first terminal of the transistor M15 is electrically connected to the wiring L4, a gate of the transistor M15 is electrically connected to a second terminal of the transistor M15 and a gate of the transistor M13.

Switches S6 and S7 have the function of controlling the electrical connection between the second terminal of the transistor M15 and the wiring BPR.

Transistors M11 and M12 form a current mirror circuit. Similarly, transistors M13 and M15 form a current mirror circuit.

The wirings L1 and L4 are preferably supplied with a high power supply potential ($V_{DD}$). The wirings L2 is preferably supplied with a low power supply potential ($V_{SS}$). Furthermore, the wiring L3 is preferably supplied with a potential $V_{DM}$.

Transistors M11 to M15 preferably operate in a saturation region. The potentials of the wirings can be adjusted as appropriate so that transistors M11 to M15 can operate in the saturation region.

<Operation Method of the First Analog Processing Circuit>

The operation method of the analog processing circuit 14 will be described with reference to FIG. 6 and FIG. 7. In the following description, transistors M11 to M13 and the transistor M15 are p-channel transistors, and the transistor M14 is an n-channel transistor.

First, in FIG. 6, a potential "0" is supplied to the wiring WP[i], and an H level is supplied to the wiring SEL[i]. Switches S3, S5 and S7 are on, and switches S1, S2, S4, and S6 are off.

Next, the potential of the node FD when the pixel PIX[i, j] obtains the first imaging data is considered. In times T7 and T8 in FIG. 5B, by replacing $V_{P1}$ with $-V_P[i,j]$, the potential of the node FD is expressed as $V_{FR}-V_P[i,j]$.

Similarly, the potential of the node FD when the pixel PIX[i, j] obtains the difference data between the first imaging data and the second imaging data is considered. In times T16 and T17 in FIG. 5B, by replacing $V_{P1}-V_{P2}$ with $-V_P[i,j]$, the potential of the node FD is expressed as $V_{FR}-V_P[i, j]$.

In both cases, the potential of the node FD is expressed as $V_{FR}-V_P[i,j]$. In this case, the current $I_P[i, j]$ that flows across the transistor M4 is expressed as in Formula (10) below.

$$I_P[i,j]=\beta(V_{FR}-V_P[i,j]-V_{th})^2 \qquad (10)$$

Similarly, the potential of node FD in the referential pixel PREF[i] is represented by $V_{FR}$. In this case, the current $I_{P0}[i]$ that flows across the transistor M4 is expressed as in Formula (11) below.

$$I_{P0}[i]=\beta(V_{FR}-V_{th})^2 \qquad (11)$$

In Formula (10) and Formula (11), $\beta$ is a coefficient, and $V_{th}$ is the threshold voltage of the transistor M4.

When all of the pixels PIX connected to the wiring BP[j] and all of the referential pixels PREF connected to the wiring BPR are considered similarly as above, the difference between the current $I_{P0}$ that flows across the wiring BPR and the current $I_P[j]$ that flows across the wiring BP[j], represented by $\Delta I[j]$, can be expressed as in Formula (12) below.

$$\begin{aligned}\Delta I[j] &= I_{P0} - I_P[j] \\ &= \sum_{i=0}^{i_{MAX}} I_{P0}[i] - \sum_{i=0}^{i_{MAX}} I_P[i, j] \\ &= -2\beta \sum_{i=0}^{i_{MAX}} (V_{th} - V_{FR})V_P[i, j] - \beta \sum_{i=0}^{i_{MAX}} V_P[i, j]^2\end{aligned} \qquad (12)$$

When a current $I_{P1}[j]$ is defined as in Formula (13), Formula (12) can be represented as Formula (14). That is, the current $I_{P1}[j]$ can be expressed with a difference between the current $I_{P0}$ and the current $I_P[j]$. Note that in this specification, the current $I_{P1}[j]$ is referred to as an offset current in some cases.

$$I_{P1}[j] = -2\beta \sum_{i=0}^{i_{MAX}} (V_{th} - V_{FR})V_P[i, j] - \beta \sum_{i=0}^{i_{MAX}} V_P[i, j]^2 \quad (13)$$

$$I_{P1}[j] = I_{P0} - I_P[j] \quad (14)$$

At this time, the current $I_P[i]$ flows across the wiring BP[j], the current $I_{P0}$ flows across the wiring BPR and the transistor M15, and a current $I_C[j]$ flows across the transistor M14.

Since the transistor M13 and the transistor M15 form a current mirror circuit, the current $I_{P0}$ that flows across the transistor M15 also flows across the transistor M13. Accordingly, the sum of the current $I_P[j]$ and the current $I_C[i]$ is found to be equal to the current $I_{P0}$ (Formula (15)).

$$I_{P0} = I_P[j] + I_C[j] \quad (15)$$

From Formula (14) and Formula (15), the current $I_C[j]$ and the current $I_{P1}[j]$ are found to be equal to each other (Formula (16)).

$$I_{P1}[j] = I_C[j] \quad (16)$$

The capacitor C11 is charged with a gate potential of the transistor M14 so that the transistor M14 can supply the current $I_C[j]$. That is, according to Formula (16), when the capacitor C11 retains the potential, the transistor M14 functions as a current source for supplying the current $I_{P1}[j]$.

Figure 7:
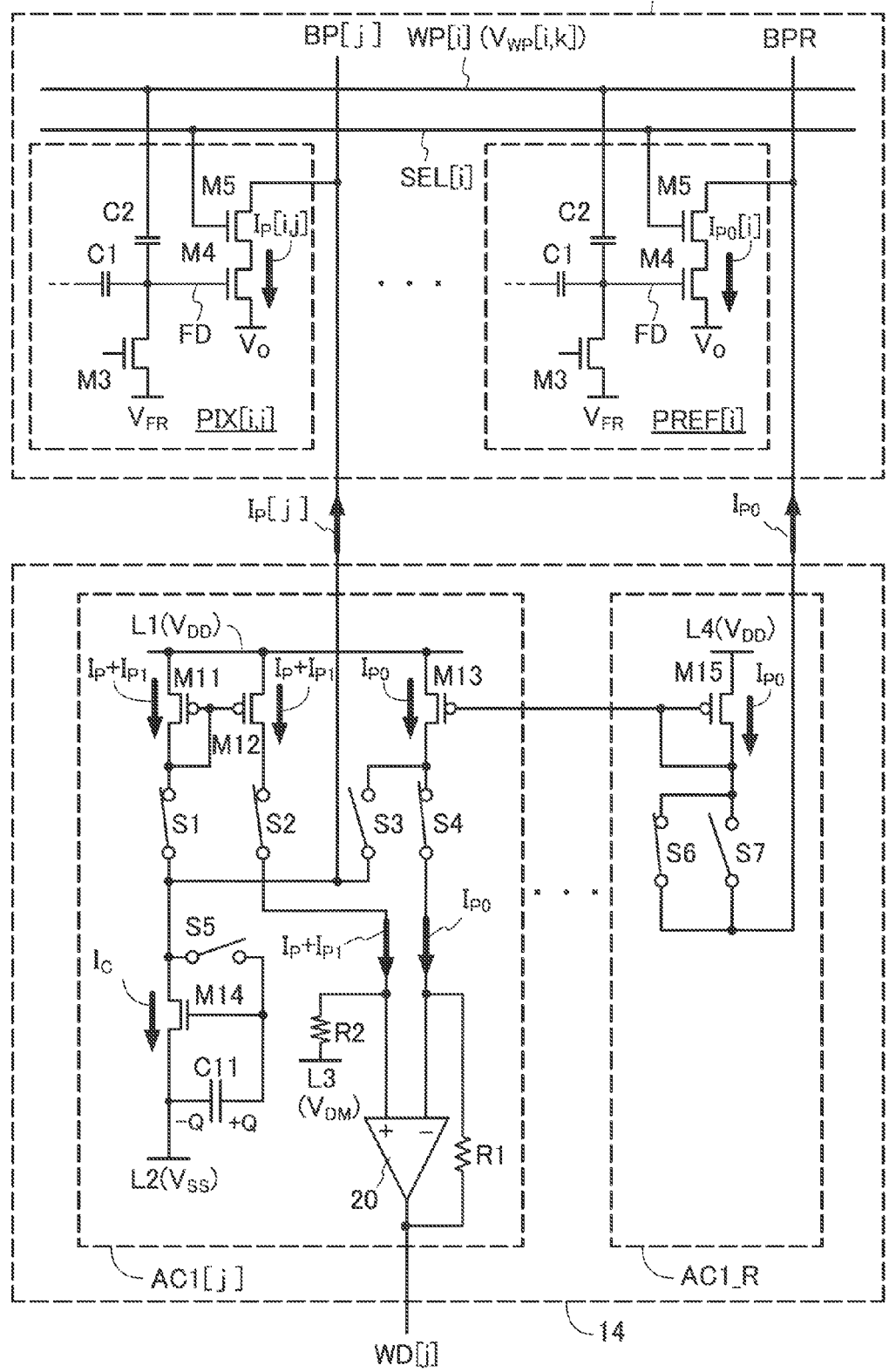
FIG. 7 is a circuit diagram illustrating a configuration example of a pixel portion and an analog processing circuit.

Next, as illustrated in FIG. 7, an H level potential is supplied to the wiring SEL[i] while a potential $V_{WP}[i, k]$ is sent to the wiring WP[i]. At this time, the switches S1, S2, S4, and S6 are on, and the switches S3, S5, and S7 are off.

The potential of the node FD in the pixel PIX[i, j] is considered again. In times T10 to T11 in FIG. 5B, by replacing $V_{WP1}$ and $V_{P1}$ with $V_{WP}[i, k]$ and $-V_P[i,j]$, respectively, the potential of the node FD is expressed as $V_{FR} - V_P[i, j] + V_{WP}[i, k]$.

Similarly, the potential of the node FD when the pixel PIX[i, j] obtains the difference data between the first imaging data and the second imaging data is considered. When $V_{WP2}$ is replaced with $V_{WP}[i, k]$, and $V_{P1} - V_{P2}$ is replaced with $-V_P[i, j]$ in times T19 to T20 in FIG. 5B, the potential of the node FD is expressed as $V_{FR} - V_P[i, j] + V_{WP}[i, k]$.

In both cases, the potential of the node FD is expressed as $V_{FR} - V_P[i, j] + V_{WP}[i, k]$. In this case, the current $I_P[i,j]$ that flows across the transistor M4 is expressed as in Formula (17) below.

$$I_P[i,j] = \beta(V_{FR} - V_P[i,j] + V_{WP}[i,k] - V_{th})^2 \quad (17)$$

Similarly, the current $I_{P0}[i]$ that flows across the transistor M4 in the referential pixel PREF[i] is expressed as in Formula (18).

$$I_{P0}[i] = \beta(V_{FR} + V_{WP}[i,k] - V_{th})^2 \quad (18)$$

When all of the pixels PIX connected to the wiring BP[j] and all of the referential pixels PREF connected to the wiring BPR are considered, the difference $\Delta I[j]$ in Formula (12) is expressed as in Formula (19), from Formula (17), Formula (18), and Formula (13).

$$\Delta I[j] = I_{P0} - I_P[j] \quad (19)$$
$$= 2\beta \sum_{i=0}^{i_{MAX}} (V_{WP}[i, k]V_P[i, j]) - 2\beta \sum_{i=0}^{i_{MAX}} (V_{th} - V_{FR})V_P[i, j] -$$
$$\beta \sum_{i=0}^{i_{MAX}} V_P[i, j]^2$$
$$= 2\beta \sum_{i=0}^{i_{MAX}} (V_{WP}[i, k]V_P[i, j]) + I_{P1}[j]$$

At this time, a current equal to the sum of the currents $I_P[j]$ and $I_C[j]$ (i.e., the sum of currents $I_P[j]$ and $I_{P1}[j]$) flows across the transistor M11 and the switch Si, and also across the transistor M12, which constitutes a current mirror circuit with the transistor M11. Furthermore, the current $I_{P0}$ flows across the transistor M15, and also across the transistor M13, which constitutes a current mirror circuit with the transistor M15.

As a result, the current $I_{P0}$ flows across the resistor R1, and a current $(I_P[j]+I_{P1}[j])$ flows across the resistor R2. When the resistance of the resistor R1 and that of the resistor R2 are assumed to be equal and expressed by R, the potential $V_{WD}[j]$ at the output terminal WD[j] of the operational amplifier 20 is expressed as in Formula (20).

$$V_{WD}[j] = V_{DM} + R(I_{P0} - (I_P[j] + I_{P1}[j])) \quad (20)$$

The potential $V_{WD}[j]$ can be expressed as in Formula (21), from Formula (3) and Formula (19).

$$V_{WD}[j] = V_{DM} + 2R\beta \sum_{i=0}^{i_{MAX}} (V_{WP}[i, k]V_P[i, j]) \quad (21)$$
$$= V_{DM} - F_j[k]$$

From the above, the analog processing circuit 14 can output the data including the potential $F_j[k]$ to the wiring WD[j], as illustrated in FIG. 3. Similarly, the analog processing circuit 14 can output the data including the potential $F_{j+1}[k]$ to a wiring WD[j+1].

Note that in the analog processing circuit 14, transistors M11, M12, M13, and M15 may be n-channel transistors, and the transistor M14 may be a p-channel transistor. In that case, it is preferable that the potential $V_{SS}$ be supplied to the wirings L1 and L4 and the potential $V_{DD}$ be supplied to the wiring L2.

Transistors with a low off-state current, such as OS transistors or transistors including a wide-bandgap semiconductor in channel formation regions, may be used as the switches S1 to S7 in the analog processing circuit 14. In particular, the transistor with a low off-state current is preferably used as the switch S5. By providing the transistor with a low off-state current as the switch S5, the offset current (the current $I_{Pi}$) can be retained for a long period.

<Memory Cell Array>

Figure 8:
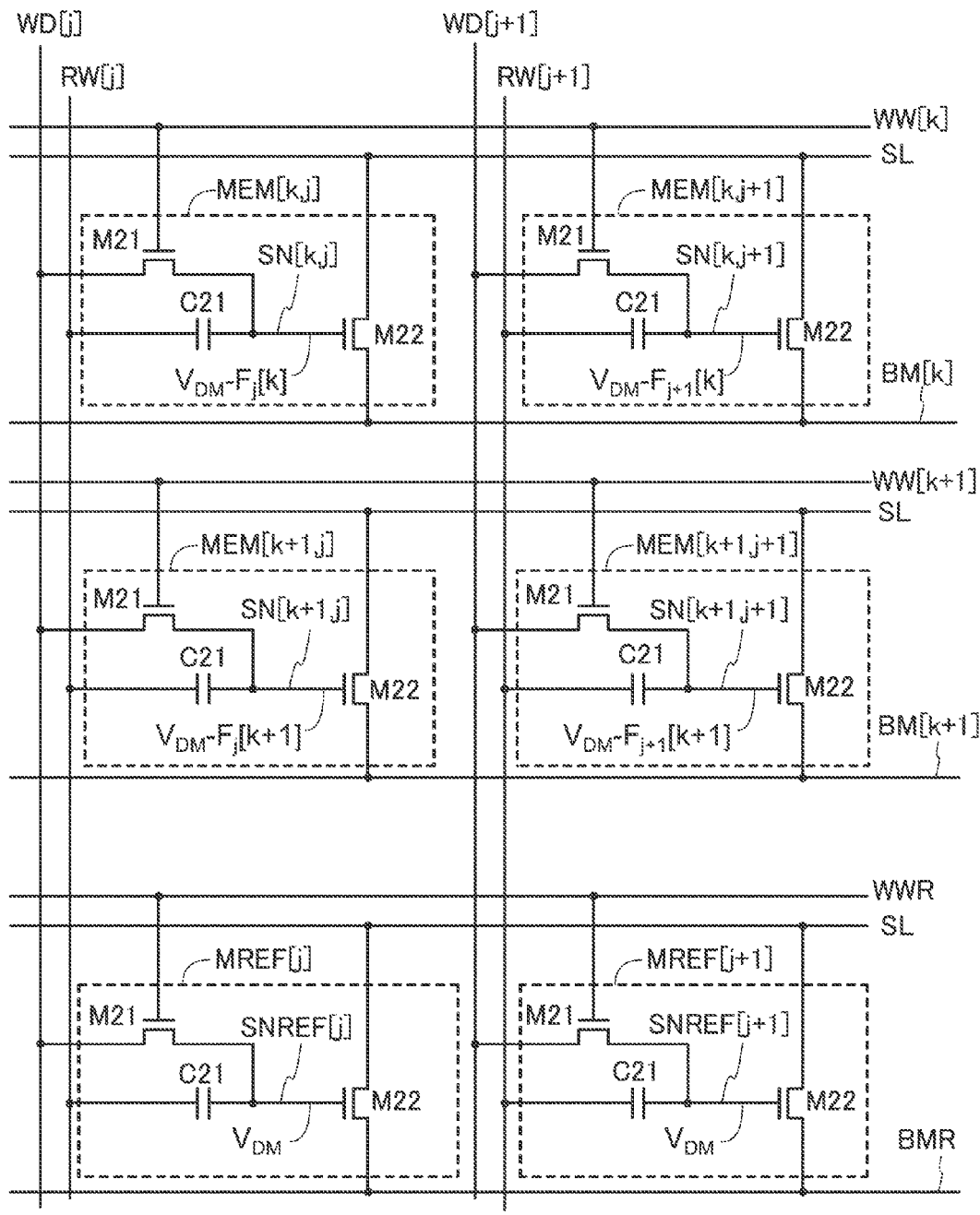
FIG. 8 is a circuit diagram illustrating a configuration example of a memory cell.

FIG. 8 is a circuit diagram illustrating the configuration of the memory cell array 18. The memory cell array 18 includes a plurality of memory cells MEM arranged in a matrix, and a plurality of referential memory cells MREF. FIG. 8 illustrates the memory cell MEM[k, j], the memory cell MEM[k, j+1], the memory cell MEM[k+1, j], the memory cell MEM[k+1, j+1], the referential memory cell MREF[j], and the referential memory cell MREF[j+1]. Note that only the memory cell MEM[k, j] and the referential memory cell MREF will be described below; the description will apply to other memory cells.

The memory cell MEM[k, j] includes transistors M21 and M22, a capacitor C21, and a node SN[k, j]. In addition, the memory cell MEM[k, j] is electrically connected to wirings WW[k], BM[k], RW[j], WD[j], and SL.

The referential memory cell MREF[j] includes transistors M21 and M22, a capacitor C21, and a node SNREF[j]. In addition, the referential memory cell MREF[i] is electrically connected to wirings WWR, BMR, RW[j], WD[j], and SL.

In the memory cell MEM[k, j], a first terminal of the capacitor C21 is electrically connected to the wiring RW[j], and a second terminal of the capacitor C21 is electrically connected to the node SN[k,j]. A gate of the transistor M22 is electrically connected to the node SN[k, j], a first terminal of the transistor M22 is electrically connected to the wiring BM[k], and a second terminal of the transistor M22 is electrically connected to the wiring SL. A gate of the transistor M21 is electrically connected to the wiring WW[k], a first terminal of the transistor M21 is electrically connected to the wiring WD[j], and a second terminal of the transistor M21 is electrically connected to the node SN[k,j].

In the referential memory cell MREF[j], the first terminal of the capacitor C21 is electrically connected to the wiring RW[j], and the second terminal of the capacitor C21 is electrically connected to the node SNREF[j]. The gate of the transistor M22 is electrically connected to the node SNREF [i], the first terminal of the transistor M22 is electrically connected to the wiring BMR, and the second terminal of the transistor M22 is electrically connected to the wiring SL. The gate of the transistor M21 is electrically connected to the wiring WWR, the first terminal of the transistor M21 is electrically connected to the wiring WD[j], and the second terminal of the transistor M21 is electrically connected to the node SNREF[i].

The node SN[k, j] has a function of retaining a charge that is written into the memory cell MEM[k, j]. Similarly, the node SNREF[i] has a function of retaining a charge that is written into the referential memory cell MREF[j].

The wiring WD[i] functions as a bit line that is supplied with data when the data is written into the node SN[k,j] or the node SNREF[j].

The wiring RW[j] functions as a word line when the data that are written into the node SN[k,j] or the node SNREF[j] are read.

The wiring BM[k] functions as a bit line when data written into the node SN[k, j] are read. Similarly, the wiring BMR functions as a bit line when data written into the node SNREF[j] are read.

The wiring SL functions as a power source line.

When the decoder 15 supplies a selection signal to the wiring WW[k], the transistor M21 of the memory cell MEM[k, j] turns on, and the potential $V_{WD}[j]$ expressed as in Formula (21) is written into the node SN[k,j]. In addition, the memory cell MEM[k, j] retains the data written in the node SN[k, j] by turning off the transistor M21.

Similarly, when the decoder 15 supplies the wiring WWR with a selection signal, the transistor M21 of the memory cell MEM[j] turns on, and the potential $V_{DM}$ is written into the node SNREF[j]. In addition, the referential memory cell MREF[j] retains the data written in the node SNREF[j] by turning off the transistor M21.

From Formula (20), the potential $V_{DM}$ which is written in the referential memory cell MREF[i] is a potential of the wiring WD[j] when $I_{P0}=I_P[j]=I_{P1}[i]=0$. That is, the potential of the wiring WD[j], in the case where all of the switches S1 to S7 in the analog processing circuit 14 are off and all the currents within the analog processing circuit 14 are blocked, is written into the referential memory cell MREF [i].

The transistor with a low off-state current, such as an OS transistor or a transistor that includes a wide-bandgap semiconductor material in the channel formation region, is preferably used as the transistor M21. The use of a transistor with a low off-state current as the transistor M21 enables data to be written to the memory cell MEM[k, j] with low power. It also enables the memory cell MEM[k, j] to retain data for a long period even in a state where the semiconductor device 10 is powered off.

<Circuit Configuration of the Second Analog Processing Circuit>

Figure 9:
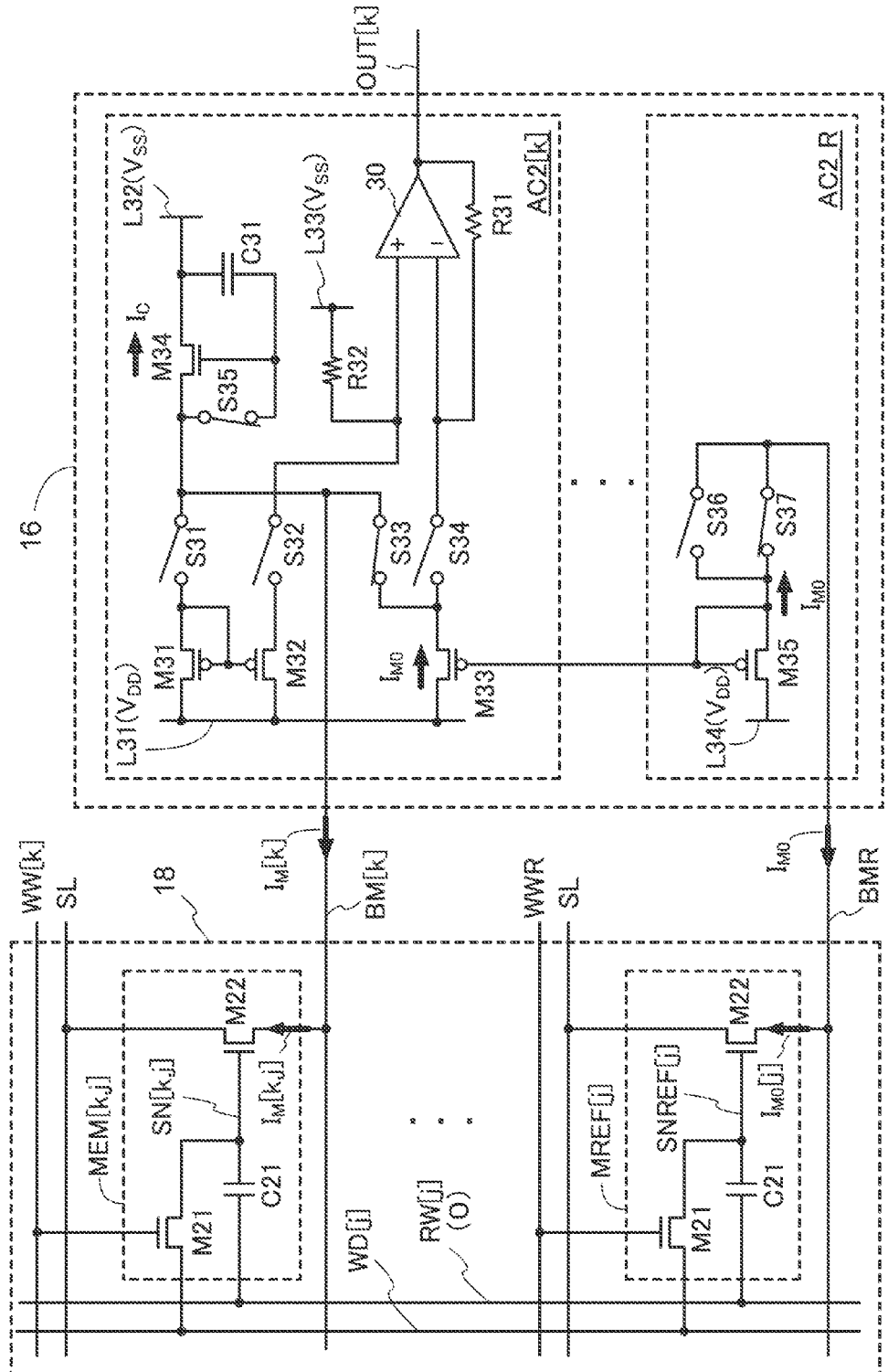
FIG. 9 is a circuit diagram illustrating a configuration example of a memory cell array and an analog processing circuit.

FIG. 9 illustrates the circuit configurations of the memory cell array 18 and the analog processing circuit 16. FIG. 9 illustrates only the memory cell MEM[k, j] and the referential memory cell MREF[j] among the components of the memory cell array 18.

The analog processing circuit 16 includes a plurality of circuits AC2 and a circuit AC2_R. Among the circuits described above, FIG. 9 illustrates a circuit AC2[*k*] and the circuit AC2_R.

The circuit AC2[*k*] includes switches S31 to S35, transistors M31 to M34, a capacitor C31, an operational amplifier 30, a resistor R31, a resistor R32, and wirings L31 to L33. In addition, the circuit AC2[*k*] is electrically connected to the memory cell MEM[k,j] through the wiring BM[k].

The circuit AC2_R includes switches S36 and S37, a transistor M35, and a wiring L34. In addition, the circuit AC2_R is electrically connected to the referential memory cell MREF [j] through the wiring BMR.

The wirings L31 and L34 are preferably supplied with a high power supply potential ($V_{DD}$). The wirings L32 and L33 are preferably supplied with a low power supply potential ($V_{SS}$).

The other configuration details of the analog processing circuit 16 are the same as those of the analog processing circuit 14; the description of the analog processing circuit 14 may be referenced.

<Operation Method of the Second Analog Processing Circuit>

The operation method of the analog processing circuit 16 will be described with reference to FIG. 9 and FIG. 10.

In FIG. 9, "0" is supplied to the wiring RW[j]; the switches S33, S35, S37 are on, and the switches S31, S32, S34, and S36 are off. At this time, the current $I_M[k, j]$ that flows across the transistor M22 in the memory cell MEM[k, j] can be expressed as in Formula (22).

$$I_M[k,j]=\gamma(V_{DM}-F_j[k]-V_{th})^2 \qquad (22)$$

Similarly, the current $I_{M0}[j]$ that flows across the transistor M22 in the referential memory cell MREF[j] can be expressed as in Formula (23).

$$I_{M0}[j]=\gamma(V_{DM}-V_{th})^2 \qquad (23)$$

In Formula (22) and Formula (23), $\gamma$ is a coefficient, and $V_{th}$ is the threshold voltage of the transistor M22.

When the aforementioned discussion of the analog processing circuit 14 is applied here, the analog processing circuit 16 can obtain a current $I_{M1}$ (an offset current) that is expressed as in Formula (24).

$$I_{M1}[j]=I_{M0}[j]-I_M[j] \qquad (24)$$

Figure 10:
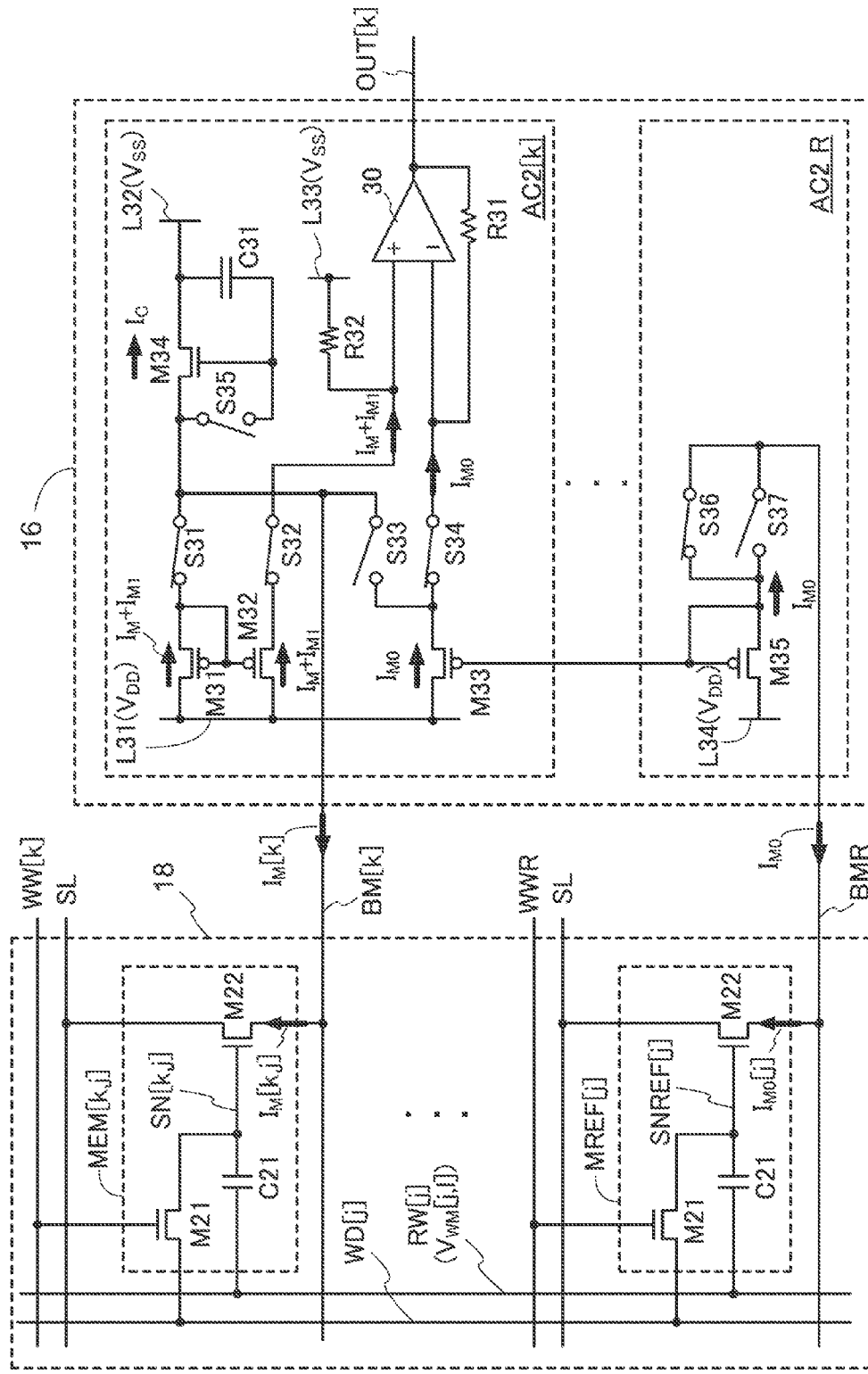
FIG. 10 is a circuit diagram illustrating a configuration example of a memory cell array and an analog processing circuit.

Next, as illustrated in FIG. 10, the switches S31, S32, S34, and S36 are turned on and the switches S33, S35, and S37 are turned off in a state where a potential $V_{WM}[j, 1]$ is supplied to the wiring RW[j]. At this time, the current $I_M$[k, j] that flows across the transistor M22 in the memory cell MEM[k,j] can be expressed as in Formula (25).

$$I_M[i,j] = \gamma(V_{WM}[j,l] + V_{DM} - F_j[k] - V_{th})^2 \quad (25)$$

Note that the potential of the wiring RW[j] is superimposed on the gate potential of the transistor M22 through the capacitor C21; therefore, the potential change of the wiring RW[j] does not directly correspond to the increase in the gate potential of the transistor M22. More specifically, the amount of gate potential increase of the transistor M22 is obtained by multiplying the amount of potential change in the wiring RW[j] with a capacitive coupling coefficient, which can be calculated from the capacitance of the capacitor C21, the gate capacitance of the transistor M22, and a parasitic capacitance. Here, for simplicity, a potential obtained by multiplication of the capacitive coupling coefficient is represented as $V_{WM}$[j, l]; a potential actually supplied to the wiring RW[j] may be converted as appropriate using the capacitive coupling coefficient.

Similarly, the current $I_{M0}$[j] that flows across the transistor M22 in the referential memory cell MREF[j] can be expressed as in Formula (26).

$$I_{M0}[j] = \gamma(V_{WM}[j,l] + V_{DM} - V_{th})^2 \quad (26)$$

When the discussion about the analog processing circuit 14 shown in FIG. 7 is applied here, the analog processing circuit 16 can obtain a potential $V_{OUT}$[k], which is expressed as in Formula (27), from the wiring OUT[j].

$$V_{OUT}[k] = R(I_{M0} - (I_M[k] + I_{MOFST}[k])) \quad (27)$$
$$= 2R\beta \sum_{j=0}^{j_{MAX}} (V_{WM}[j,l]F_j[k])$$

From Formula (27) and Formula (6), $V_{OUT}$[k]=F[k, l] is satisfied.

From the above, the analog processing circuit 16 can output data including the potential F[k, l] to the wiring OUT[k], as illustrated in FIG. 3. Similarly, the analog processing circuit 16 can output data including the potential F[k+1, l] to the wiring OUT[k+1], as illustrated in FIG. 4.

Transistors with a low off-state current, such as OS transistors or transistors including a wide-bandgap semiconductor in the channel formation regions, may be used as the switches S31 to S37 in the analog processing circuit 16. In particular, the transistor with a low off-state current is preferably used as the switch S35. By providing a transistor with a low off-state current as the switch S35, the offset current (the current $I_{M1}$) can be retained for a long period.

<Specific Configuration Example and Timing Chart of the Analog Processing Circuit>

More specific configuration examples of the analog processing circuits 14 and 16 will be described with reference to FIGS. 11 and 12. Furthermore, the operation of the semiconductor device 10 will be described specifically with reference to the timing charts shown in FIGS. 13 and 14.

Figure 11:
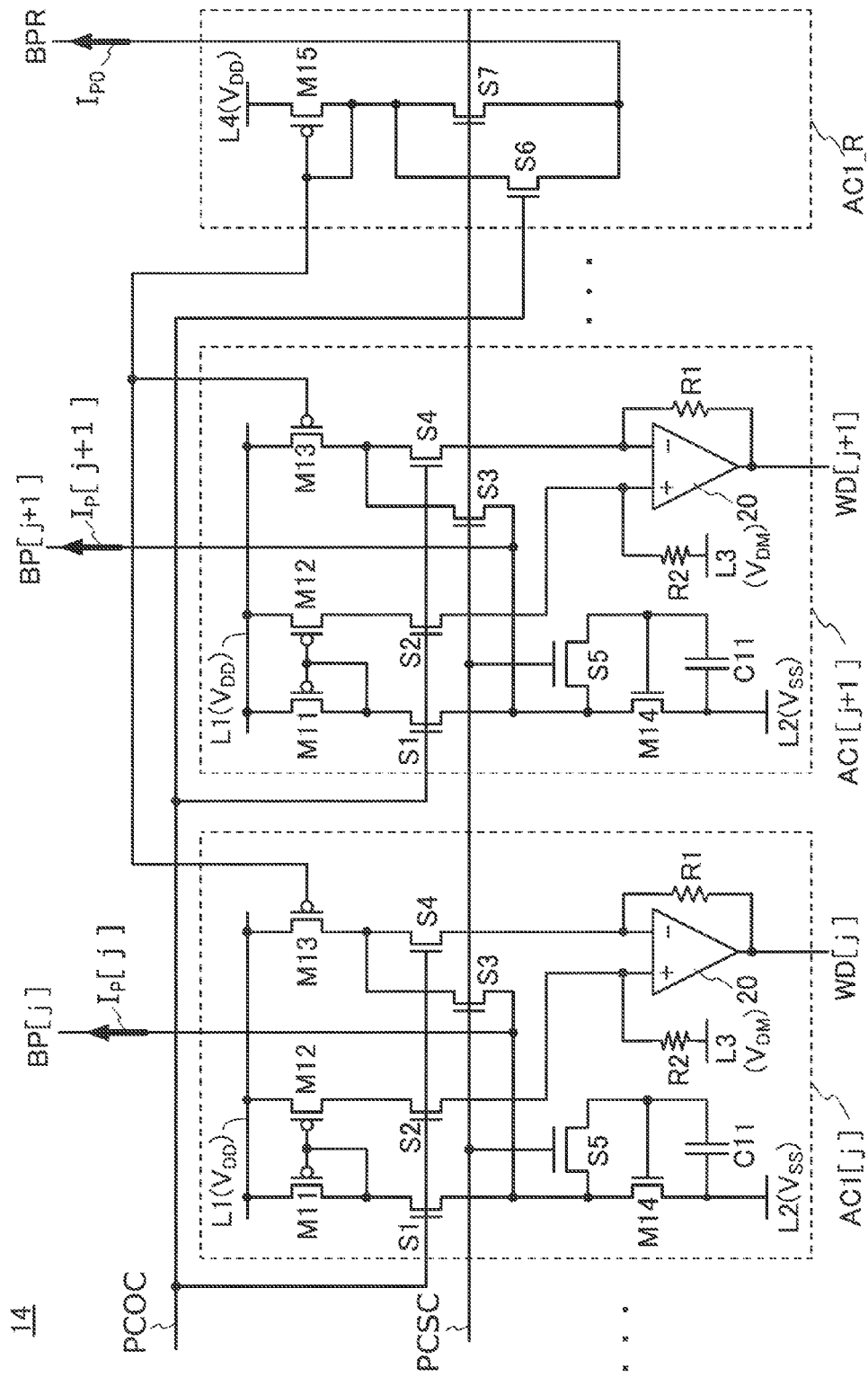
FIG. 11 is a circuit diagram illustrating a structure example of an analog processing circuit.

FIG. 11 is a circuit diagram in which n-channel transistors are used as switches S1 to S7 in FIG. 6 and a wiring PCOC and a wiring PCSC are provided. The wiring PCOC has a function of controlling the on/off states of switches S1, S2, S4, and S6. The wiring PCSC has a function of controlling the on/off states of switches S3, S5, and S7. When an H level potential is supplied to the wiring PCOC, the switches S1, S2, S4, and S6 turn on. When an H level potential is supplied to the wiring PCSC, the switches S3, S5, and S7 turn on.

Figure 12:
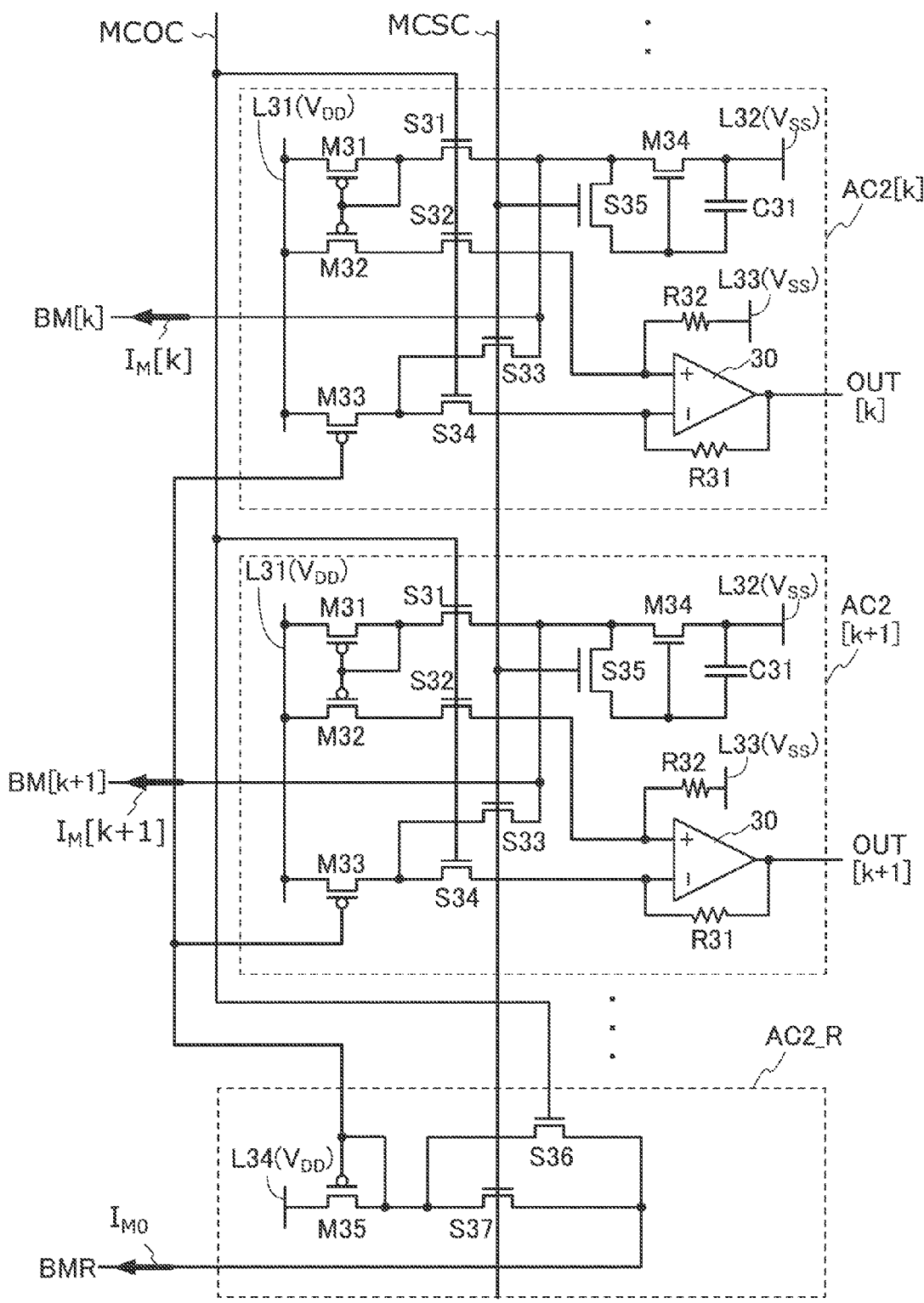
FIG. 12 is a circuit diagram illustrating a structure example of an analog processing circuit.

FIG. 12 is a circuit diagram in which n-channel transistors are used as switches S31 to S37 in FIG. 9 and a wiring MCOC and a wiring MCSC are provided. The wiring MCOC has a function of controlling the on/off states of switches S31, S32, S34, and S36. The wiring MCSC has a function of controlling the on/off states of switches S33, S35, and S37. When an H level potential is supplied to the wiring MCOC, switches S31, S32, S34, and S36 turn on. When an H level potential is supplied to the wiring MCSC, the switches S33, S35, and S37 turn on.

Note that switches S1 to S7 in FIG. 11 or FIG. 12 may be p-channel transistors. Alternatively, switches S1 to S7 may be complementary MOS switches (CMOS switches or analog switches). Similarly, switches S31 to S37 in FIG. 12 may be p-channel transistors. Alternatively, switches S31 to S37 may be complementary MOS switches.

Figure 13:
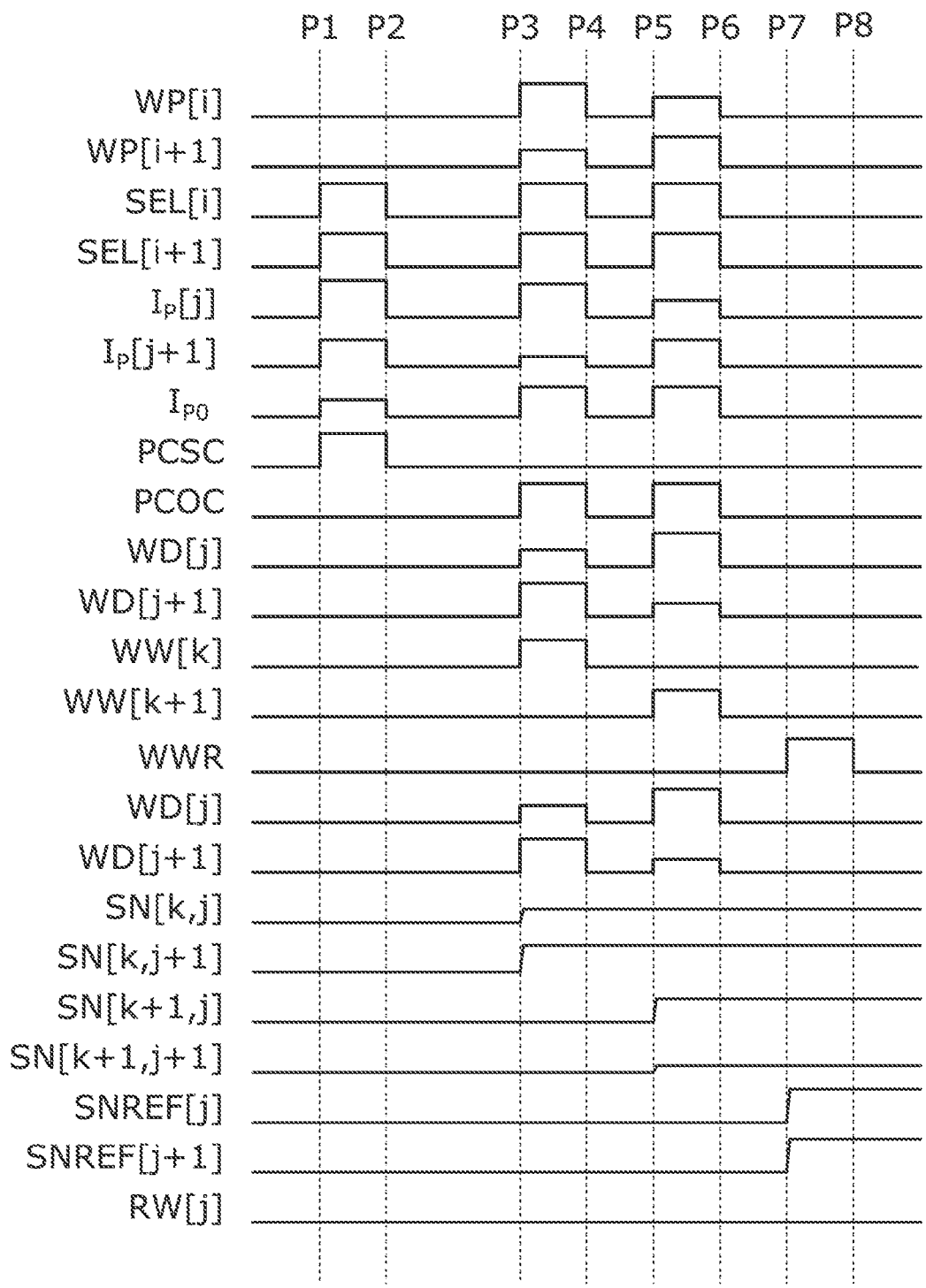
FIG. 13 is a timing chart showing an operation example of the semiconductor device.

In FIG. 13, times P1 to P2 correspond to a period in which offset current of the pixels PIX and the referential pixels PREF is obtained. Times P3 to P6 correspond to a period in which the first imaging data to be output from the pixel PIX is generated, the data passes through the analog processing circuit 14, and the data is stored in the memory cell MEM. Alternatively, times P3 to P6 correspond to a period in which the difference data between the first and second imaging data that are output from the pixel PIX is generated, the data passes through the analog processing circuit 14, and the data is stored in the memory cell MEM.

In times P1 to P2, the potential of the wiring WP[i] is set to 0, the potential of the wiring WP[i+1] is 0, and the wiring PCSC is at an H level. At this time, the analog processing circuit 14 is in a state shown in FIG. 6, and obtains current $I_{P1}$, which is expressed as in Formula (14).

In times P3 to P4, the potential of the wiring WP[i] is set at $V_{WP}$[i, k], the potential of the wiring WP[i+1] is set at $V_{WP}$[i+1, k], and the wiring PCOC is set at an H level. At this time, the analog processing circuit 14 is in a state shown in FIG. 7; in this state, the wiring WD[j] outputs $V_{DM}-F_j[k]$, and the wiring WD[j+1] outputs $V_{DM}-F_{j+1}[k]$.

In times P3 to P4, when the wiring WW[k] is set at an H level and the wiring WW[k+1] is set at an L level, the potentials of the wirings WD[j] and WD[j+1] are written into memory cells MEM[k, j], and MEM[k, j+1], respectively; thus, the potentials of nodes SN[k, j] and SN[k, j+1] are set to $V_{DM}-F_j[k]$ and $V_{DM}-F_{j+1}[k]$, respectively.

In times P5 to P6, the potential of the wiring WP[i] is set at $V_{WP}$[i, k+1], the potential of the wiring WP[i+1] is set at $V_{WP}$[i+1, k+1], and the wiring PCOC is set at an H level. At this time, similarly to times P3 to P4, the wiring WD[j] outputs $V_{DM}-F_j[k+1]$, and the wiring WD [j+1] outputs $V_{DM}-F_{j+1}[k+1]$.

In times P5 to P6, when the wiring WW[k] is set at an L level and the wiring WW[k+1] is set at an H level, the potential of the wirings WD[j] and WD[j+1] are written into memory cells MEM[k+1, j] and MEM[k+1, j+1], respectively; thus, the potentials of nodes SN[k+1, j] and SN[k+1, j+1] are set to $V_{DM}-F_j[k+1]$ and $V_{DM}-F_{j+1}[k+1]$, respectively.

In times P7 to P8, when the wirings PCSC and PCOC are set at an L level and the wiring WWR is set at an H level, the potential of the node SNREF[j] in the referential memory cell MREF[i] is set at $V_{DM}$, and the potential of a node SNREF[j+1] of the referential memory cell MREF[j+1] is also set at $V_{DM}$.

Figure 14:
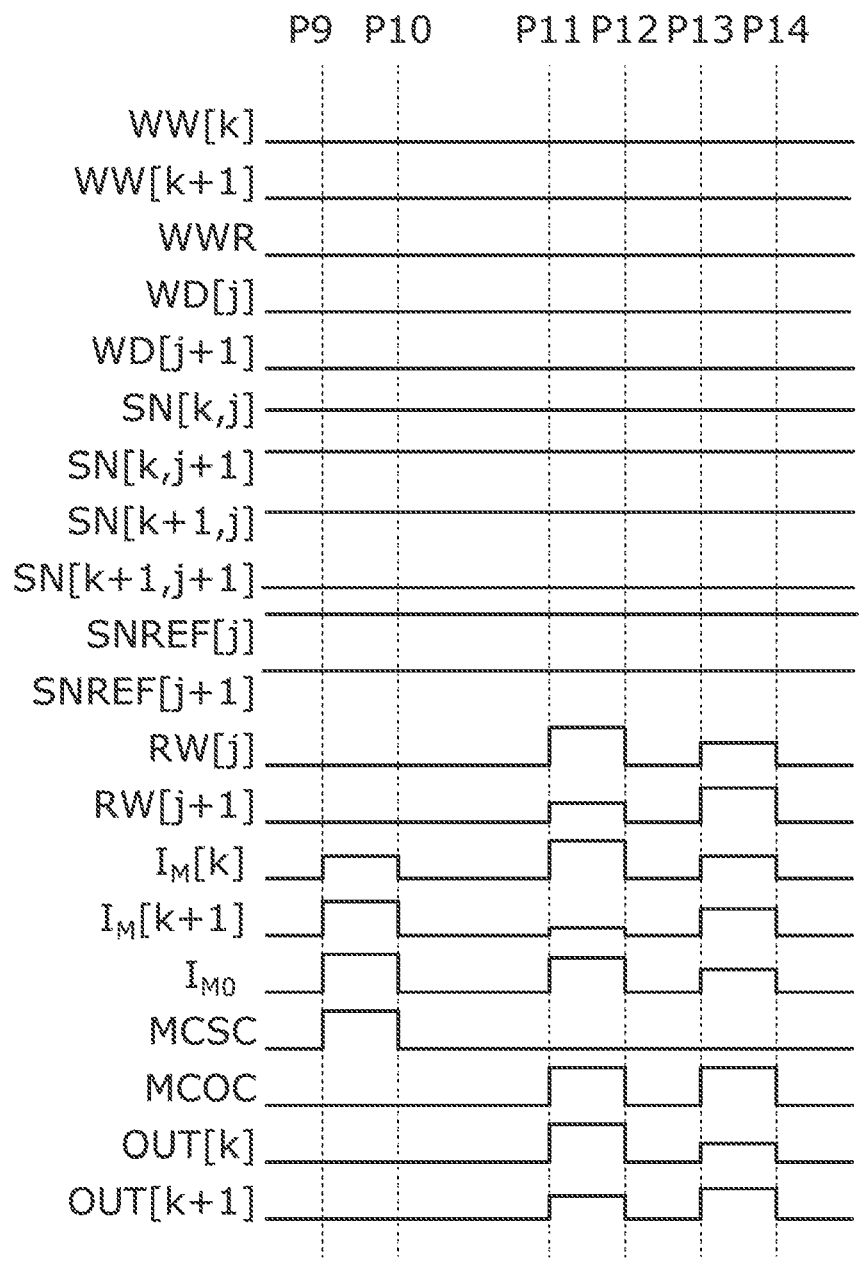
FIG. 14 is a timing chart showing an operation example of the semiconductor device.

In times P9 to P10 in FIG. 14, the wiring MCSC is set at an H level, and the potentials of the wirings RW[j] and RW[j+1] are set at 0. At this time, the analog processing circuit 16 is in a state shown in FIG. 9, and obtains a current $I_{M1}[j]$ shown in Formula (24).

In times P11 to P12, the potential of the wiring RW[j] is set at $V_{WM}[j, l]$, the potential of the wiring RW[j+1] is set at $V_{WM}[i+1, l]$, and the wiring MCOC is set at an H level. At this time, the analog processing circuit 16 is in a state shown in FIG. 10; the wiring OUT[k] obtains the potential F[k, l], and the wiring OUT[k+1] obtains the potential F[k+1, l].

In times P13 to P14, the potential of the wiring RW[j] is set at $V_{WM}[i, l+1]$, the potential of the wiring RW[j+1] is set at $V_{WM}[j+1, l+1]$, and the wiring MCOC is set at an H level. At this time, the analog processing circuit 16 is in the state shown in FIG. 10; the wiring OUT[k] obtains the potential F[k, l+1], and the wiring OUT[k+1] obtains the potential F[k+1, l+1].

From the above, the semiconductor device 10 obtains the potentials F[k, l], F[k+1, l], F[k, l+1], and F[k+1, l+1] from the imaging data obtained from the pixel portion 13.

Embodiment 2

In this embodiment, configuration examples of a device that can be applied to the semiconductor device 10 described in Embodiment 1 will be described with reference to FIG. 15, FIGS. 16A and 16B, FIG. 17, FIGS. 18A and 18B, FIGS. 19A and 19B, FIG. 20, FIG. 21, and FIG. 22.

<Configuration Example 1 of the Semiconductor Device>

Figure 15:
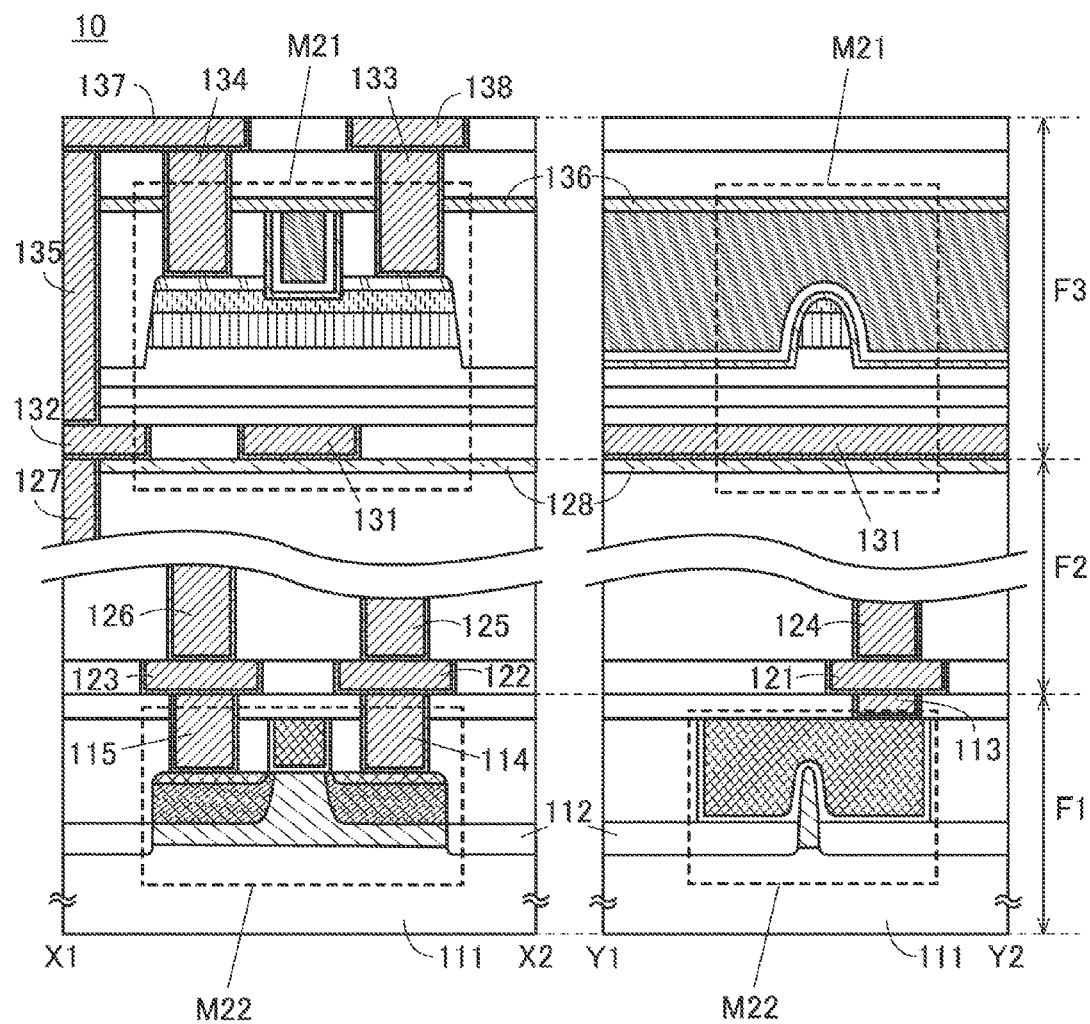
FIG. 15 is a cross-sectional diagram illustrating a structure example of a semiconductor device.

Cross-sectional diagrams shown in FIG. 15 illustrate a configuration example of the semiconductor device 10. The semiconductor device 10 illustrated in FIG. 15 includes the transistors M21 and M22. A cross-sectional diagram of the semiconductor device 10 in the channel length direction of the transistors M21 and M22 is shown on the left side of FIG. 15, and a cross-sectional diagram of the semiconductor device 10 in the channel width direction of the transistors M21 and M22 is shown on the right side of FIG. 15.

The semiconductor device 10 includes layers F1, F2, and F3, which are stacked in that order from the bottom.

The layer F1 includes the transistor M22, a substrate 111, an element isolation layer 112, a plug 113, a plug 114, a plug 115, and the like.

The layer F2 includes a wiring 121, a wiring 122, a wiring 123, a plug 124, a plug 125, a plug 126, a plug 127, an insulator 128, and the like.

The layer F3 includes the transistor M21, a wiring 131, a wiring 132, a plug 133, a plug 134, a plug 135, an insulator 136, a wiring 137, a wiring 138, and the like.

FIG. 15 illustrates an example in which an OS transistor is used as the transistor M21.

In the case where an OS transistor is used as the transistor M21, the insulators 128 and 136 each preferably have a function of blocking oxygen, hydrogen, water, an alkali metal, an alkaline earth metal, or the like. By providing the insulators 128 and 136, diffusion of oxygen contained in the transistor M21 to the outside and entry of hydrogen, moisture, or the like into the transistor M21 from the outside can be prevented.

A nitride insulator can be used for the insulators 128 and 136, for example. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride. In particular, an aluminum oxide film is preferably used as each of the insulators 128 and 136 because it is highly effective in preventing permeation of both oxygen and impurities such as hydrogen and moisture.

The transistor M22 is provided over the substrate 111 and isolated from another adjacent transistor by the element isolation layer 112. Silicon oxide, silicon oxynitride, silicon nitride oxide, silicon nitride, or the like can be used for the element isolation layer 112. Note that in this specification, an oxynitride refers to a compound that contains more oxygen than nitrogen, and a nitride oxide refers to a compound that contains more nitrogen than oxygen.

As the substrate 111, a single crystal semiconductor substrate or a polycrystalline semiconductor substrate of silicon or silicon carbide, a compound semiconductor substrate of silicon germanium, a silicon-on-insulator (SOI) substrate, or the like can be used. Alternatively, a glass substrate, a quartz substrate, a plastic substrate, a metal substrate, an attachment film, paper including a fibrous material, or a base film may be used as the substrate 111, for example. Alternatively, a semiconductor element may be formed using one substrate and then transferred to another substrate.

Alternatively, a flexible substrate may be used as the substrate 111. As a method for providing a transistor over a flexible substrate, there is a method in which the transistor is formed over a non-flexible substrate and then the transistor is separated and transferred to the substrate 111 which is a flexible substrate. In that case, a separation layer is preferably provided between the non-flexible substrate and the transistor. As the substrate 111, a sheet, a film, or a foil containing a fiber may be used. The substrate 111 may have elasticity. The substrate 111 may have a property of returning to its original shape when bending or pulling is stopped. Alternatively, the substrate 111 may have a property of not returning to its original shape. The thickness of the substrate 111 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 111 has a small thickness, the weight of the semiconductor device can be reduced. When the substrate 111 has a small thickness, even when glass and the like are used, the substrate 111 may have elasticity or a property of returning to its original shape when bending or pulling is stopped. This can alleviate the impact caused by dropping or the like which is applied on the semiconductor device over the substrate 111. That is, a durable semiconductor device can be provided. For the substrate 111 which is a flexible substrate, for example, metal, an alloy, resin, glass, or fiber thereof can be used. The flexible substrate 111 preferably has a lower coefficient of linear expansion because deformation induced by an environment will be suppressed. The flexible substrate 111 may be formed using, for example, a material whose coefficient of linear expansion is lower than or equal to $1 \times 10^{-3}$/K, lower than or equal to $5 \times 10^{-5}$/K, or lower than or equal to $1 \times 10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used for the flexible substrate 111 because of its low coefficient of linear expansion.

In the example illustrated in FIG. 15, a single crystal silicon wafer is used as the substrate 111.

The wirings and the plugs illustrated in FIG. 15 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. Furthermore, the conductive layers are preferably formed using a Cu—Mn alloy, since in that case, manganese oxide formed at the interface with an insulator containing oxygen has a function of preventing Cu diffusion.

Alternatively, the wirings and the plugs illustrated in FIG. 15 may be formed using a transparent conductive material containing indium oxide, tin oxide, or zinc oxide. As the transparent conductive material, for example, indium oxide, indium tin oxide, indium zinc oxide, zinc oxide, zinc oxide to which gallium is added, or the like can be used.

Alternatively, the wirings and the plugs illustrated in FIG. 15 may have a layered structure of any of the above metals and any of the above transparent conductive materials.

A capacitor may be provided in the semiconductor device 10 as necessary. For example, the capacitor may be provided in a layer over the transistor M21. For example, the capacitor may be provided in a layer between the transistor M21 and the transistor M22. For example, the capacitor may be provided in the same layer as the transistor M21. For example, the capacitor may be provided in the same layer as the transistor M22.

Transistors M21 and M22 are described below in detail with reference to FIGS. 16A and 16B, FIG. 17, FIGS. 18A and 18B, FIGS. 19A and 19B.

<Transistor M22>

Figure 16A:
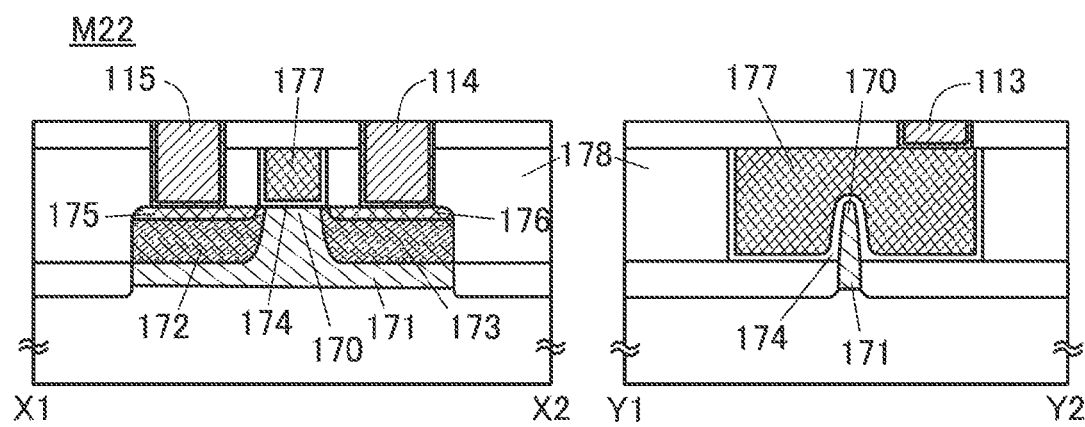
FIGS. 16A and 16B show cross-sectional diagrams and a top view illustrating a structure example of a semiconductor device.
Figure 16B:
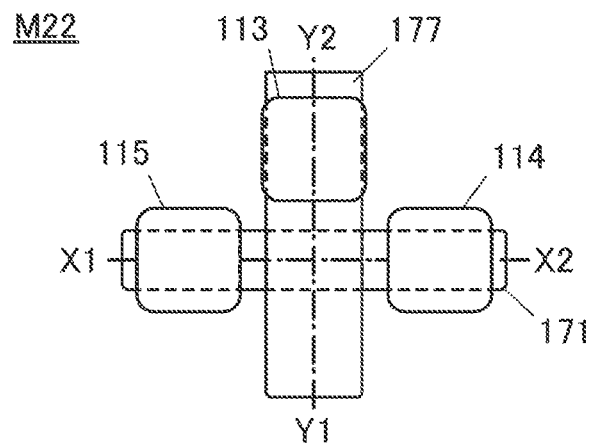

FIG. 16A illustrates the layer F1 in the cross-sectional diagram of FIG. 15. FIG. 16B is a top view of the transistor M22. Note that for simplification, some components are not illustrated in the top view of FIG. 16B. A cross-sectional diagram taken along the dashed-dotted line X1-X2 in FIG. 16B is illustrated on the left side of FIG. 16A, and a cross-sectional diagram taken along the dashed-dotted line Y1-Y2 in FIG. 16B is illustrated on the right side of FIG. 16A. Note that the direction of the dashed-dotted line X1-X2 is also referred to as the channel length direction of the transistor M22, and the direction of the dashed-dotted line Y1-Y2 is also referred to as the channel width direction of the transistor M22.

The transistor M22 includes a channel formation region 170 and impurity regions 172 and 173 provided in a well 171, conductive regions 175 and 176 provided in contact with the impurity regions 172 and 173, a gate insulator 174 provided over the channel formation region 170, and a gate electrode 177 provided over the gate insulator 174. Metal silicide or the like may be used for the conductive regions 175 and 176.

In the transistor M22 in FIG. 16A, the channel formation region 170 has a projecting portion, and the gate insulator 174 and the gate electrode 177 are provided along side and top surfaces of the projecting portion. The transistor with such a shape is referred to as a FIN-type transistor. Although the projecting portion is formed by processing part of the semiconductor substrate in this embodiment, a semiconductor layer with a projecting portion may be formed by processing an SOI substrate.

In the example illustrated in FIG. 16A, a Si transistor is used as the transistor M22.

The insulator 178 functions as an interlayer insulator. In the case where a Si transistor is used as the transistor M22, the insulator 178 preferably contains hydrogen. When the insulator 178 contains hydrogen, dangling bonds of silicon can be terminated and thus the reliability of the transistor M22 can be improved. For the insulator 178, silicon oxide, silicon oxynitride, silicon nitride oxide, silicon nitride, or the like is preferably used.

Figure 17:
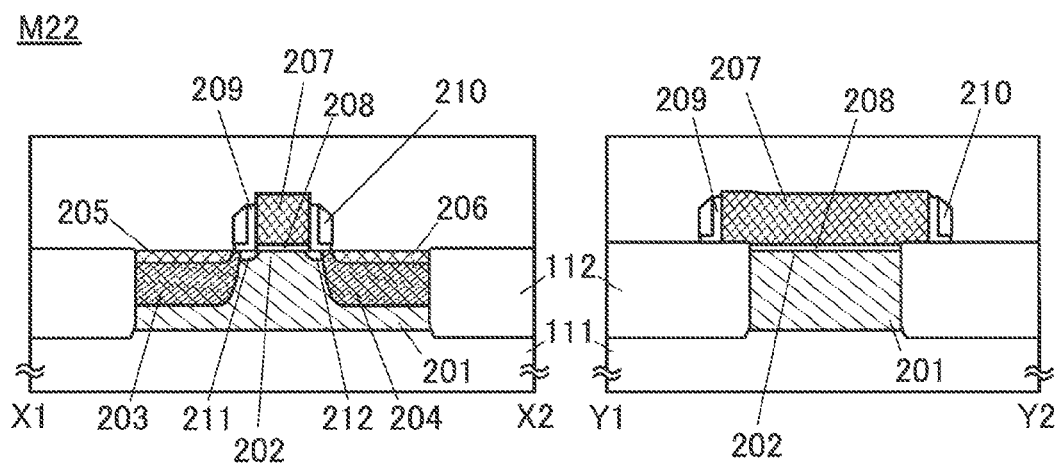
FIG. 17 is a cross-sectional diagram illustrating a structure example of a transistor.

Note that the transistor M22 may be a planar transistor. An example of such a structure is illustrated in FIG. 17. The transistor M22 illustrated in FIG. 17 includes a channel formation region 202, low-concentration impurity regions 211 and 212 provided in a well 201; high-concentration impurity regions 203 and 204; conductive regions 205 and 206 provided in contact with the high-concentration impurity regions 203 and 204; a gate insulator 208 provided over the channel formation region 202; a gate electrode 207 provided over the gate insulator 208; and sidewall insulating layers 209 and 210 provided on sidewalls of the gate electrode 207. The conductive regions 205 and 206 may be formed using a metal silicide or the like.

<Transistor M21>

Figure 18A:
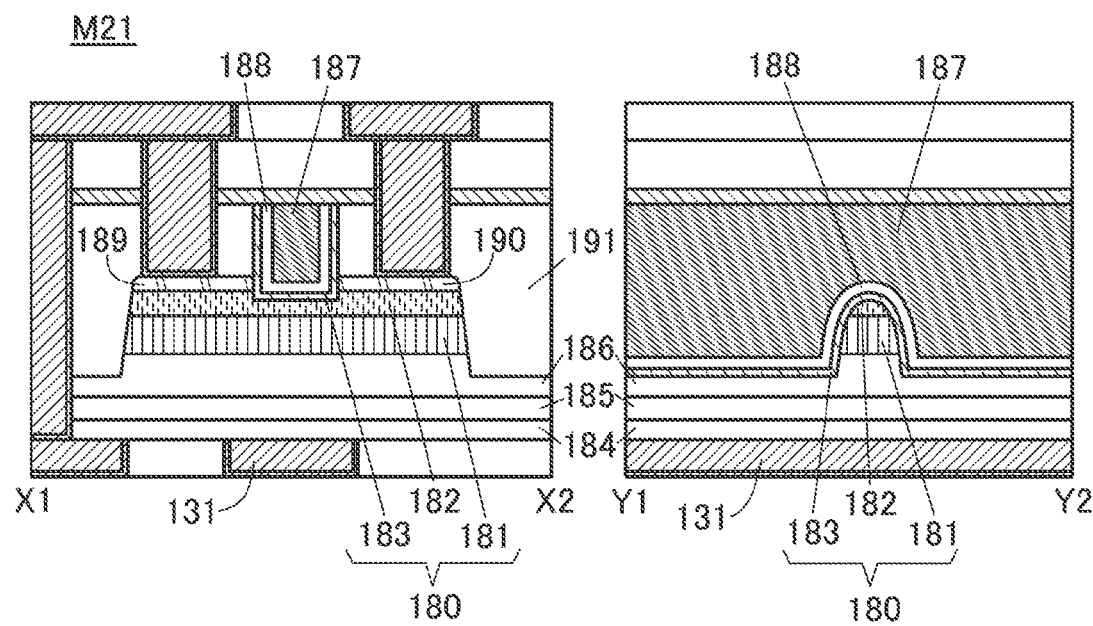
FIGS. 18A and 18B show cross-sectional diagrams and a top view illustrating a structure example of a transistor.
Figure 18B:
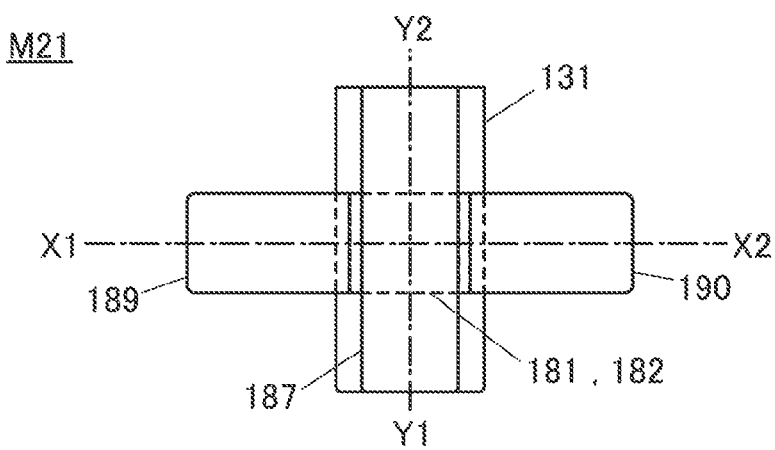

FIG. 18A illustrates the layer F3 in the cross-sectional diagram of FIG. 15. FIG. 18B is a top view of the transistor M21. Note that for simplification, some components are not illustrated in the top view of FIG. 18B. A left part of FIG. 18A shows a cross-sectional diagram taken along dashed-dotted line X1-X2 in FIG. 18B and a right part of FIG. 18A shows a cross-sectional diagram taken along dashed-dotted line Y1-Y2 in FIG. 18B. Note that the direction of the dashed-dotted line X1-X2 is also referred to as the channel length direction of the transistor M21, and the direction of the dashed-dotted line Y1-Y2 is also referred to as the channel width direction of the transistor M21.

The transistor M21 includes the wiring 131; an insulator 184 formed so as to cover the wiring 131; an insulator 185 over the insulator 184; an insulator 186 over the insulator 185; a stack in which an oxide semiconductor 181 and an oxide semiconductor 182 are stacked in this order over the insulator 186; a conductor 189 in contact with a top surface of the oxide semiconductor 182; a conductor 190 in contact with the top surface of the oxide semiconductor 182; an insulator 191 over the conductors 189 and 190; an oxide semiconductor 183 in contact with the oxide semiconductors 181 and 182, the conductors 189 and 190, and the insulator 191; an insulator 188 over the oxide semiconductor 183; and a conductor 187 over the insulator 188. The oxide semiconductor 181, the oxide semiconductor 182, and the oxide semiconductor 183 are collectively called an oxide semiconductor 180.

The oxide semiconductor 182 functions as a channel formation region of the transistor M21.

In the transistor M21, the oxide semiconductor 181 or the oxide semiconductor 183 includes a region through which electrons do not pass (a region which does not function as a channel). For that reason, in the transistor M21, the oxide semiconductor 181 or the oxide semiconductor 183 is also referred to as an insulator in some cases.

The oxide semiconductor 181 and the oxide semiconductor 182 include regions 192 and 193. The region 192 is formed in the vicinity of a region where the oxide semiconductors 181 and 182 are in contact with the conductor 189. The region 193 is formed in the vicinity of a region where the oxide semiconductors 181 and 182 are in contact with the conductor 190.

The conductor 189 functions as one of a first terminal and a second terminal of the transistor M21. Similarly, the conductor 190 functions as the other of the first terminal and the second terminal of the transistor M21.

The conductor 187 functions as a first gate electrode of the transistor M21.

The insulator 188 functions as a first gate insulator of the transistor M21.

The wiring 131 functions as a second gate electrode of the transistor M2.

The conductor 187 and the wiring 131 may be supplied with the same potential or different potentials. Note that the wiring 131 may be omitted in some cases.

The insulators 184 to 186 function as a base insulator of the transistor M21 and a second gate insulator of the transistor M21.

The insulator 191 functions as a protective insulator or an interlayer insulator of the transistor M21.

As illustrated in FIG. 18A, the side surface of the oxide semiconductor 182 is surrounded by the conductor 187. With this structure, the oxide semiconductor 182 can be electrically surrounded by an electric field of the conductor 187. A transistor structure in which a semiconductor is electrically surrounded by an electric field of a gate electrode is referred to as a surrounded channel (s-channel) structure. Therefore, a channel is formed in the entire oxide semiconductor 182 (bulk). In an s-channel structure, a large amount of current can flow between a source and a drain of a transistor, so that the transistor can have a high on-state current.

The s-channel structure enables a high on-state current of transistors fabricated therewith; therefore, this structure is suitable for a semiconductor device such as a large-scale integration (LSI) circuit which requires a miniaturized transistor. A semiconductor device including the miniaturized transistor can be made highly integrated and can have a high density.

The conductor 187 serving as the gate electrode is formed in a self-aligned manner so as to fill an opening formed in the insulator 191. As illustrated in FIG. 18A, the conductor 187 and the conductor 189 preferably do not overlap with each other. Furthermore, the conductor 187 and the conductor 190 preferably do not overlap with each other. With such a structure, the parasitic capacitance generated between the conductor 187 and the conductor 189 or between the conductor 187 and the conductor 190 can be lower, and thus a reduction in the operation speed of transistors M21 can be prevented.

Figure 19A:
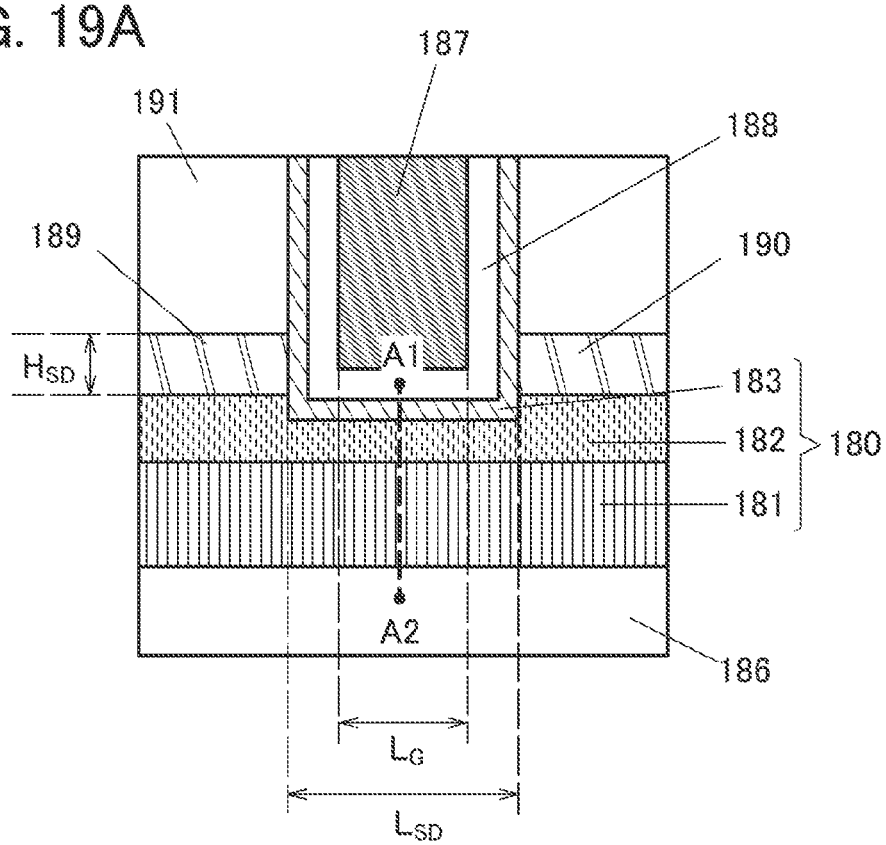
FIG. 19A is a cross-sectional diagram of the central portion of the transistor.

FIG. 19A shows an enlarged view of the center of the transistor M21. In FIG. 19A, a width $L_G$ denotes the length of the bottom surface of the conductor 187, which faces and lies parallel to the top surface of the oxide semiconductor 182 with the insulator 188 and the oxide semiconductor 183 positioned therebetween. The width $L_G$ is the line width of the gate electrode. In addition, the distance between the conductor 189 and the conductor 190 is shown as width $L_{SD}$ in FIG. 19A. The width $L_{SD}$ is the distance between the source electrode and the drain electrode.

In general, the width $L_{SD}$ is determined by the minimum feature size. As shown in FIG. 19A, the width $L_G$ is narrower than the width $L_{SD}$. This signifies that the line width of the gate electrode of the transistor M21 can be smaller than the minimum feature size. Specifically, the width $L_G$ can be 5 nm or wider and 60 nm or narrower, or preferably 5 nm or wider and 30 nm or narrower.

In FIG. 19A, a height $H_{SD}$ denotes the thickness of the conductor 189 or the thickness of the conductor 190.

The thickness of the insulator 188 is preferably less than or equal to the height $H_{SD}$, in which case the electric field of the gate electrode can be applied to the entire channel formation region. The thickness of the insulator 188 is less than or equal to 30 nm, and preferably less than or equal to 10 nm.

Components of the transistor M21 will be described below.

<<Oxide Semiconductor>>

First, an oxide semiconductor that can be used as the oxide semiconductors 181 to 183 is described.

The oxide semiconductor 182 is an oxide semiconductor containing indium (In), for example. The oxide semiconductor 182 can have high carrier mobility (electron mobility) by containing indium, for example. The oxide semiconductor 182 preferably contains an element M. The element M is preferably aluminum (Al), gallium (Ga), tin (Sn), or the like. Other elements that can be used as the element M are, for example, boron (B), silicon (Si), titanium (Ti), iron (Fe), nickel (Ni), germanium (Ge), yttrium (Y), zirconium (Zr), molybdenum (Mo), lanthanum (La), cerium (Ce), neodymium (Nd), hafnium (Hf), tantalum (Ta), tungsten (W), and the like. Note that two or more of the above elements may be used in combination as the element M. The element M is an element having high bonding energy with oxygen, for example. The element M is an element whose bonding energy with oxygen is higher than that of indium, for example. The element M is an element that can increase the energy gap of the oxide semiconductor, for example. Furthermore, the oxide semiconductor 182 preferably contains zinc (Zn). When the oxide semiconductor contains zinc, the oxide semiconductor is easily crystallized, in some cases.

Note that the oxide semiconductor 182 is not limited to the oxide semiconductor containing indium. The oxide semiconductor 182 may be an oxide semiconductor that does not contain indium and contains at least one of zinc, gallium, and tin (e.g., a zinc tin oxide or a gallium tin oxide).

For the oxide semiconductor 182, an oxide semiconductor with a wide energy gap is used, for example. The energy gap of the oxide semiconductor 182 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide semiconductor 182 is preferably a CAAC-OS film which is described later.

The oxide semiconductors 181 and 183 include, for example, one or more, or two or more elements other than oxygen included in the oxide semiconductor 182. Since the oxide semiconductors 181 and 183 include one or more, or two or more elements other than oxygen included in the oxide semiconductor 182, an interface state is less likely to be formed at an interface between the oxide semiconductors 181 and 182 and an interface between the oxide semiconductors 182 and 183.

In the case where the oxide semiconductor 181 or the oxide semiconductor 183 is an In—M-Zn oxide and the total proportion of In and M is assumed to be 100 atomic %, the proportions of In and M are preferably set to be less than 50 atomic % and greater than 50 atomic %, respectively, more preferably less than 25 atomic % and greater than 75 atomic %, respectively. When the oxide semiconductor 181 or the oxide semiconductor 183 is formed by a sputtering method, a sputtering target with the following atomic ratio is preferably used. For example, In:M:Zn is preferably 1:2:4, 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, 1:6:9, 1:10:1, 1:5:6, or an atomic ratio which is in the neighborhood of any of the above atomic ratios.

The oxide semiconductor 181 or the oxide semiconductor 183 does not necessarily contain indium in some cases. For example, the oxide semiconductor 181 or the oxide semiconductor 183 may be gallium oxide or an M-Zn oxide. In the case where the M-Zn oxide is formed by a sputtering method, a sputtering target with an atomic ratio of M:Zn=10:1 or an atomic ratio in the neighborhood thereof is preferably used.

In the case of using an In—M-Zn oxide as the oxide semiconductor 182, when the total proportion of In and M is assumed to be 100 atomic %, the proportions of In and M are preferably set to be greater than 25 atomic % and less than 75 atomic %, respectively, more preferably greater than 34 atomic % and less than 66 atomic %, respectively. When the oxide semiconductor 182 is formed by a sputtering method, a sputtering target with the following atomic ratio is preferably used. For example, In:M:Zn is preferably 1:1:1, 1:1:0.5, 1:1:1.2, 2:1:1.5, 2:1:2.3, 2:1:3, 3:1:2, 4:2:4.1, 5:1:7, or an atomic ratio which is in the neighborhood of any of the above atomic ratios.

Figure 19B:
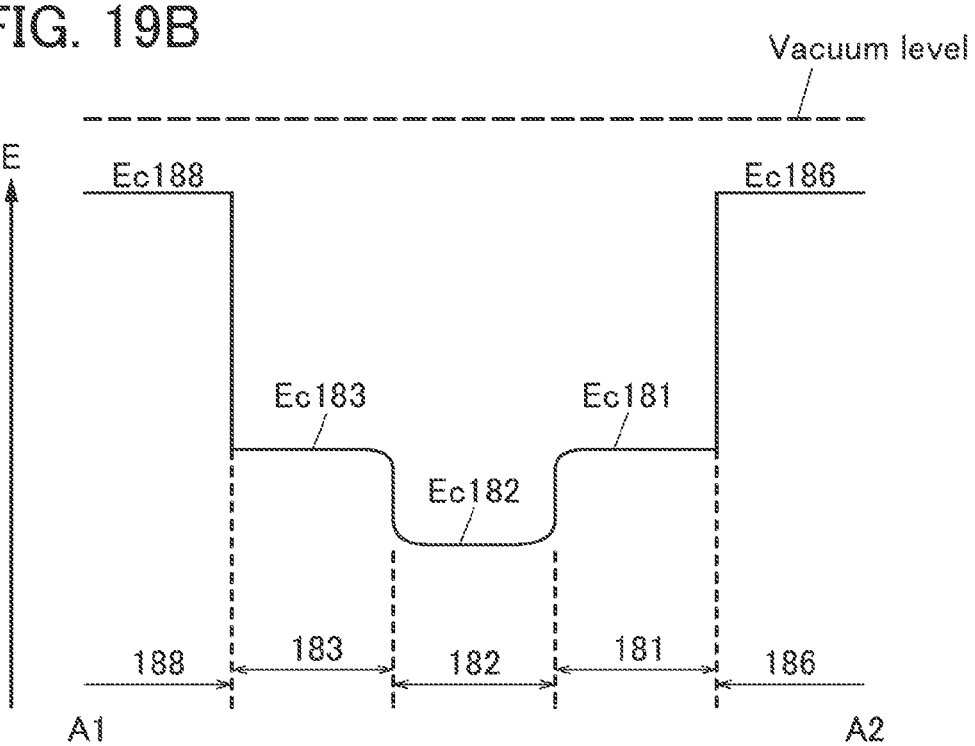
FIG. 19B is an energy band diagram.

The function and effect of the oxide semiconductor 180, which includes a stack of the oxide semiconductors 181 to 183, are described with reference to the energy band diagram of FIG. 19B. FIG. 19B shows an energy band structure of a portion taken along dashed line A1-A2 in FIG. 19A.

In FIG. 19B, Ec186, Ec181, Ec182, Ec183, and Ec188 indicate the energies at the bottoms of the conduction bands of the insulator 186, the oxide semiconductor 181, the oxide semiconductor 182, the oxide semiconductor 183, and the insulator 188, respectively.

Here, a difference in energy between the vacuum level and the bottom of the conduction band (the difference is also referred to as electron affinity) corresponds to a value obtained by subtracting an energy gap from a difference in energy between the vacuum level and the valence band maximum (the difference is also referred to as an ionization potential). The energy gap can be measured using a spectroscopic ellipsometer. The energy difference between the vacuum level and the valence band maximum can be measured using an ultraviolet photoelectron spectroscopy (UPS) device.

Since the insulators 186 and 188 are insulators, Ec186 and Ec188 are closer to the vacuum level (i.e., have a lower electron affinity) than Ec181, Ec182, and Ec183.

The oxide semiconductor 182 is an oxide semiconductor having an electron affinity higher than those of the oxide semiconductors 181 and 183. For example, as the oxide semiconductor 182, an oxide semiconductor having an electron affinity higher than those of the oxide semiconductors 181 and 183 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used.

An indium gallium oxide has a small electron affinity and an excellent oxygen-blocking property. Therefore, the oxide semiconductor 183 preferably contains indium gallium oxide. The gallium atomic ratio[Ga/(In+Ga)] is, for example, higher than or equal to 70%, preferably higher than or equal to 80%, more preferably higher than or equal to 90%.

At this time, when gate voltage is applied, a channel is formed in the oxide semiconductor 182 having the highest electron affinity among the oxide semiconductors 181 to 183.

At this time, electrons move mainly in the oxide semiconductor 182, not in the oxide semiconductors 181 and 183. Hence, the on-state current of the transistor hardly varies even when the density of interface states, which inhibit electron movement, is high at the interface between the oxide semiconductor 181 and the insulator 186 or at the interface between the oxide semiconductor 183 and the insulator 188. The oxide semiconductors 181 and 183 function as an insulator.

In some cases, there is a mixed region of the oxide semiconductors 181 and 182 between the oxide semiconductors 181 and 182. Furthermore, in some cases, there is a mixed region of the oxide semiconductors 182 and 183 between the oxide semiconductors 182 and 183. The mixed region has a low interface state density. Because the mixed region has a low interface state density, a stack of the oxide semiconductors 181 to 183 has a band structure where energy in the vicinity of each interface changes continuously (continuous junction).

As described above, the interface between the oxide semiconductors 181 and 182 or the interface between the oxide semiconductors 182 and 183 has a low interface state density. Hence, electron movement in the oxide semiconductor 182 is less likely to be inhibited and the on-state current of the transistor can be increased.

Electron movement in the transistor is inhibited, for example, in the case where physical unevenness in a channel formation region is large. To increase the on-state current of the transistor, for example, the root mean square (RMS) roughness in a measurement area of 1 μm×1 μm of a top surface or a bottom surface of the oxide semiconductor 182 (a formation surface; here, the top surface of the oxide semiconductor 181) is less than 1 nm, preferably less than 0.6 nm, more preferably less than 0.5 nm, still more preferably less than 0.4 nm. The average surface roughness (also referred to as Ra) in the measurement area of 1 μm×1 μm is less than 1 nm, preferably less than 0.6 nm, more preferably less than 0.5 nm, still more preferably less than 0.4 nm. The maximum difference (P–V) in the measurement area of 1 μm×1 μm is less than 10 nm, preferably less than 9 nm, more preferably less than 8 nm, still more preferably less than 7 nm. RMS roughness, Ra, and P–V can be measured using, for example, a scanning probe microscope SPA-500 manufactured by SII Nano Technology Inc.

The electron movement is also inhibited, for example, in the case where the density of defect states is high in a region where a channel is formed. For example, in the case where the oxide semiconductor 182 contains oxygen vacancies (also denoted by $V_O$), donor levels are formed by entry of hydrogen into sites of oxygen vacancies in some cases. A state in which hydrogen enters sites of oxygen vacancies is denoted by $V_O H$ in the following description in some cases. $V_O H$ is a factor of decreasing the on-state current of the transistor because $V_O H$ scatters electrons. Note that sites of oxygen vacancies become more stable by entry of oxygen than by entry of hydrogen. Thus, by decreasing oxygen vacancies in the oxide semiconductor 182, the on-state current of the transistor can be increased in some cases.

For example, at a certain depth in the oxide semiconductor 182 or in a certain region of the oxide semiconductor 182, the concentration of hydrogen measured by secondary ion mass spectrometry (SIMS) is set at be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the oxide semiconductor 182, for example, there is a method in which excess oxygen contained in the insulator 186 is moved to the oxide semiconductor 182 through the oxide semiconductor 181. In that case, the oxide semiconductor 181 is preferably a layer having oxygen permeability (a layer through which oxygen can pass or permeate).

Note that in the case where the transistor has an s-channel structure, a channel is formed in the entire oxide semiconductor 182. Therefore, the thicker the oxide semiconductor 182 is, the larger a channel region is. In other words, the thicker the oxide semiconductor 182 is, the higher the on-state current of the transistor is.

Moreover, the thickness of the oxide semiconductor 183 is preferably as small as possible to increase the on-state current of the transistor. For example, the oxide semiconductor 183 may have a region with a thickness of less than 10 nm, preferably less than or equal to 5 nm, more preferably less than or equal to 3 nm. Meanwhile, the oxide semiconductor 183 has a function of blocking entry of elements other than oxygen (such as hydrogen and silicon) included in the adjacent insulator into the oxide semiconductor 182 where a channel is formed. Thus, the oxide semiconductor 183 preferably has a certain thickness. For example, the oxide semiconductor 183 may have a region with a thickness of greater than or equal to 0.3 nm, preferably greater than or equal to 1 nm, more preferably greater than or equal to 2 nm. The oxide semiconductor 183 preferably has an oxygen blocking property to inhibit outward diffusion of oxygen released from the insulator 186 and the like.

To improve reliability, preferably, the thickness of the oxide semiconductor 181 is large and the thickness of the oxide semiconductor 183 is small. For example, the oxide semiconductor 181 may have a region with a thickness of greater than or equal to 10 nm, preferably greater than or equal to 20 nm, more preferably greater than or equal to 40 nm, still more preferably greater than or equal to 60 nm. An increase in the thickness of the oxide semiconductor 181 can increase the distance from the interface between the adjacent insulator and the oxide semiconductor 181 to the oxide semiconductor 182 where a channel is formed. Note that the oxide semiconductor 181 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon measured by SIMS analysis is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the oxide semiconductors 182 and 181. A region in which the concentration of silicon measured by SIMS is higher than or equal to $1\times10^{16}$ atoms/cm$^3$ and lower than $1\times10^{19}$ atoms/cm$^3$, preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$ is provided between the oxide semiconductors 182 and 183.

It is preferable to reduce the concentration of hydrogen in the oxide semiconductors 181 and 183 in order to reduce the concentration of hydrogen in the oxide semiconductor 182. The oxide semiconductors 181 and 183 each have a region in which the concentration of hydrogen measured by SIMS is higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is also preferable to reduce the concentration of nitrogen in the oxide semiconductors 181 and 183 in order to reduce the concentration of nitrogen in the oxide semiconductor 182. The oxide semiconductors 181 and 183 each have a region in which the concentration of nitrogen measured by SIMS is higher than or equal to $1\times10^{16}$ atoms/cm$^3$ and lower than $5\times10^{19}$ atoms/cm$^3$, preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The above three-layer structure is an example. For example, a two-layer structure without the oxide semiconductor 181 or 183 may be employed. Alternatively, a four-layer structure may be employed in which one of the semiconductors given as examples of the oxide semiconductors 181 to 183 is provided over or under the oxide semiconductor 181 or over or under the oxide semiconductor 183. Further alternatively, an n-layer structure (n is an integer of 5 or more) may be employed in which one of the semiconductors given as examples of the oxide semiconductors 181 to 183 is provided at two or more of the following positions: over the oxide semiconductor 181, under the oxide semiconductor 181, over the oxide semiconductor 183, and under the oxide semiconductor 183.

<<Base Insulator>>

Examples of the material of the insulator 184 include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 184 may be formed using silicon oxide with high step coverage which is formed by reacting tetraethyl orthosilicate (TEOS), silane, or the like with oxygen, nitrous oxide, or the like.

An oxide material that releases some of its oxygen by heating is contained in the insulator 186. The insulator 186 preferably contains an oxide containing more oxygen than that in the stoichiometric composition. An oxide film containing more oxygen than that in the stoichiometric composition releases some of its oxygen by heating. Oxygen released from the insulator 186 is supplied to the oxide semiconductor 180, so that oxygen vacancies in the oxide semiconductor 180 can be reduced. Consequently, changes in the electrical characteristics of the transistor can be reduced and the reliability of the transistor can be improved.

The oxide film containing more oxygen than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulator 186 preferably contains an oxide that can supply oxygen to the oxide semiconductor 180. For example, a material containing silicon oxide or silicon oxynitride is preferably used for the insulator 186. Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 186.

To make the insulator 186 contain excess oxygen, the insulator 186 is formed in an oxygen atmosphere, for example. Alternatively, a region containing excess oxygen may be formed by introducing oxygen into the insulator 186 after the film is formed. Both the methods may be combined.

For example, oxygen (at least including any of oxygen radicals, oxygen atoms, and oxygen ions) may be introduced into the insulator 186 that has been formed, so that a region containing excess oxygen is formed. Oxygen can be introduced by an ion implantation method, an ion doping method, a plasma immersion ion implantation method, plasma treatment, or the like.

A gas containing oxygen can be used for treatment to introduce oxygen. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Furthermore, hydrogen or the like may be included. For example, a mixed gas of carbon dioxide, hydrogen, and argon may be used.

After the insulator 186 is formed, the insulator 186 may be subjected to planarization treatment using a chemical mechanical polishing (CMP) method or the like to improve the planarity of the top surface thereof.

The insulator 185 has a passivation function of preventing oxygen contained in the insulator 186 from decreasing by bonding to metal contained in the wiring 131.

The insulator 185 has a function of blocking oxygen, hydrogen, water, alkali metal, alkaline earth metal, and the like. Providing the insulator 185 can prevent outward diffusion of oxygen from the oxide semiconductor 180 and entry of hydrogen, water, or the like into the oxide semiconductor 180 from the outside.

A nitride insulator can be used for the insulator 185, for example. Examples of the nitride insulator include silicon nitride, silicon nitride oxide, aluminum nitride, and aluminum nitride oxide. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor M21 can be controlled by injecting electrons into a charge trap layer. The charge trap layer is preferably provided in the insulator 184 or the insulator 185. For example, when the insulator 185 is formed using hafnium oxide, aluminum oxide, tantalum oxide, aluminum silicate, or the like, the insulator 185 can function as a charge trap layer.

<<Gate Electrode, Source Electrode, and Drain Electrode>>

The conductors 187, 189, and 190 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive layers are preferably formed using a low-resistance conductive material such as aluminum or copper. The conductive layers are preferably formed using a Cu—Mn alloy, since in that case, manganese oxide formed at the interface with an insulator containing oxygen has a function of preventing Cu diffusion.

For the conductors 187, 189, and 190, a transparent conductive material containing indium oxide, tin oxide, or zinc oxide can also be used. Examples of the transparent conductive material include indium oxide, indium tin oxide (ITO), indium zinc oxide, zinc oxide, and zinc oxide to which gallium is added.

Alternatively, a stack of any of the above metals and any of the above transparent conductive materials may be used for the conductors 187, 189, and 190.

The oxide semiconductor 182 preferably includes low-resistance regions in contact with the conductor 189 and the conductor 190. When the oxide semiconductor 182 includes the low-resistance regions, contact resistance between the oxide semiconductor 182 and the conductors 189 and 190 can be reduced.

The low-resistance regions are formed when, for example, the conductors 189 and 190 extract oxygen from the oxide semiconductor 182. Oxygen is more likely to be extracted as the heating temperature is higher. Hydrogen enters sites of the oxygen vacancies, increasing the carrier concentration. Thus, the low-resistance regions are formed.

<<Gate Insulator>>

The insulator 188 preferably includes an insulator with a high relative dielectric constant. For example, the insulator 188 preferably contains silicon oxide, silicon oxynitride, silicon nitride, silicon nitride oxide, gallium oxide, hafnium oxide, an oxide containing aluminum and hafnium, an oxynitride containing aluminum and hafnium, an oxide containing silicon and hafnium, an oxynitride containing silicon and hafnium, or the like.

The insulator 188 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide is on the oxide semiconductor 183 side and silicon oxide or silicon oxynitride is on the conductor 187 side, entry of silicon from silicon oxide or silicon oxynitride into the oxide semiconductor 182 can be prevented.

<Interlayer Insulator and Protective Insulator>

The insulator 191 preferably includes an insulator with a low relative dielectric constant. For example, the insulator 191 preferably contains silicon oxide, silicon oxynitride, silicon nitride oxide, silicon nitride, or a resin. Alternatively, the insulator 191 preferably has a layered structure containing silicon oxide or silicon oxynitride and a resin. Because silicon oxide and silicon oxynitride have thermal stability, combination of silicon oxide or silicon oxynitride with a resin allows the stacked-layer structure to be thermally stable and have a low relative dielectric constant. Examples of the resin include polyester, polyolefin, polyamide (e.g., nylon or aramid), polyimide, polycarbonate, and acrylic.

<Configuration Example 2 of the Semiconductor Device>

Next, configuration examples of the device with a photodiode are described with reference to FIG. 20, FIG. 21, and FIG. 22.

Figure 20:
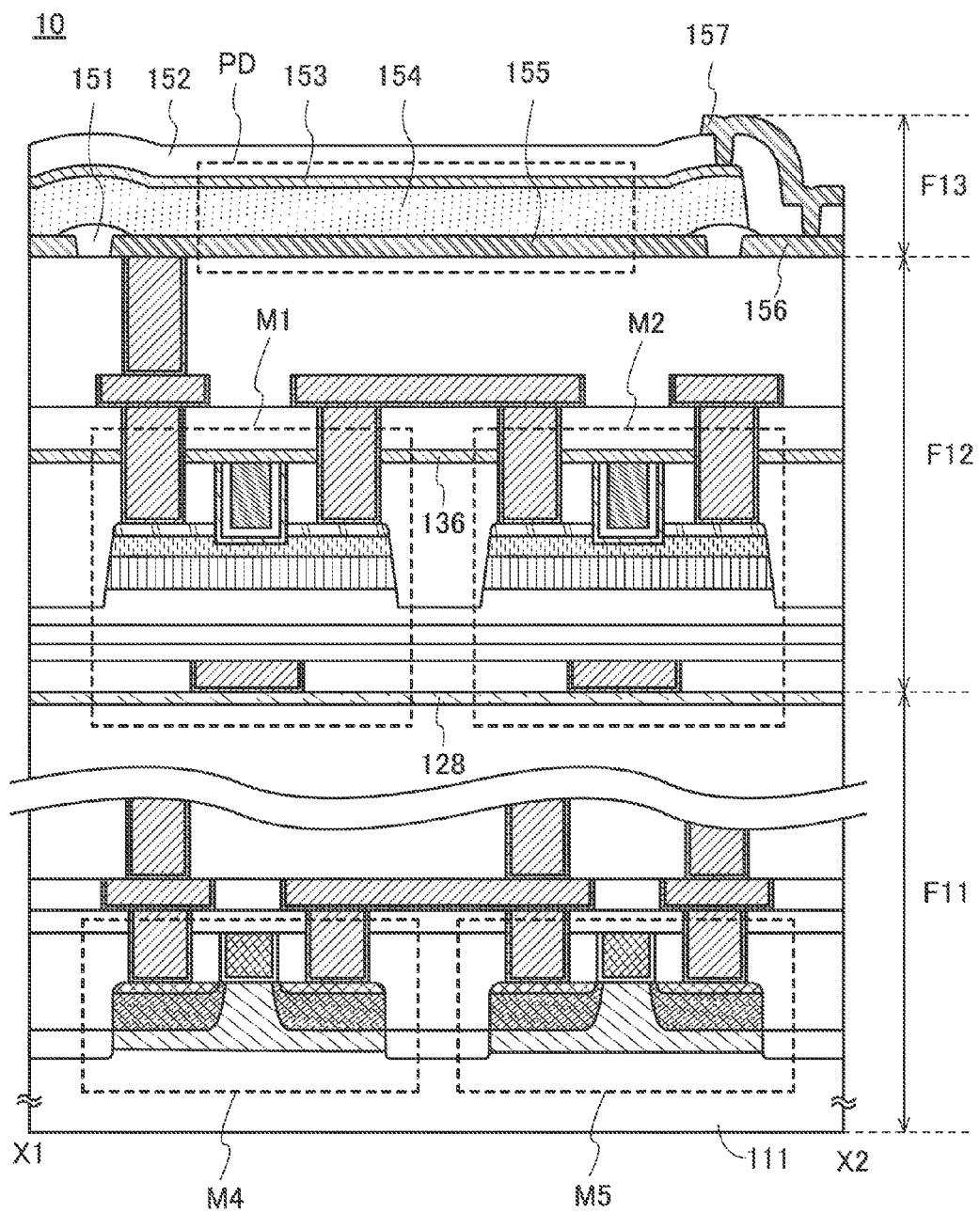
FIG. 20 is a cross-sectional diagram illustrating a structure example of a semiconductor device.

The cross-sectional diagram shown in FIG. 20 illustrates a configuration example of the semiconductor device 10 that includes a photodiode.

The semiconductor device 10 shown in FIG. 20 includes layers F11, F12, and F13, which are stacked in that order from the bottom.

The layer F11 includes the substrate 111, the transistors M4 and M5, the insulator 128, wirings, and plugs. FIG. 20 illustrates an example in which Si transistors are used as the transistors M4 and M5. The description of the transistor M22 illustrated in FIG. 15 can be referenced to understand the details of the transistors M4 and M5.

The layer F12 includes the transistors M1 and M2, the insulator 136, wirings, and plugs. The description of the transistor M21 illustrated in FIG. 15 can be referenced to understand the details of the transistors M1 and M2.

The layer F13 includes the photodiode PD, a wiring 156, a wiring 157, a partition 151, and a protective insulator 152. The photodiode PD includes an electrode 153, a photoelectric conversion layer 154, and an electrode 155. Note that in the photodiode PD, the photoelectric conversion layer 154 is irradiated with light from the top side of the drawing, that is, from the side of the electrode 153.

In the example illustrated in FIG. 20, a selenium-based material is used in the photoelectric conversion layer 154. The photodiode PD including the selenium-based material has high external quantum efficiency to visible light. Furthermore, the selenium-based material has a high light-absorption coefficient, facilitating the thinning of the photoelectric conversion layer 154. The photodiode PD including the selenium-based material utilizes avalanche multiplication, enabling a high-sensitivity sensor with a large amplification factor. In other words, the use of a selenium-based material for the photoelectric conversion layer 154 allows a sufficient amount of photocurrent to be obtained even when the pixel area is reduced. Therefore, the photodiode PD including a selenium-based material is also suitable for imaging in a low-illuminance environment.

Amorphous selenium or crystalline selenium can be used as the selenium-based material. Crystalline selenium can be obtained by, for example, depositing amorphous selenium and then performing heat treatment. Making the crystal grain size of crystalline selenium smaller than a pixel pitch can reduce the variation in characteristics between pixels. Moreover, crystalline selenium has higher spectral sensitivity and light-absorption coefficient to visible light than those of amorphous selenium.

Although the photoelectric conversion layer 154 is illustrated as a single layer in FIG. 20, a layer of gallium oxide, cerium oxide, an In—Ga—Zn oxide, or the like may be provided as a hole injection blocking layer on the electrode 153 side. Alternatively, a layer of nickel oxide, antimony sulfide, or the like may be provided as an electron injection blocking layer on an electrode 155 side. Note that depending on the circuit configuration of the pixel PIX, the direction of the connection of the photodiode PD may differ from that in FIG. 5A. Therefore, the hole injection blocking layer and the electron injection blocking layer described above may change places with each other.

The photoelectric conversion layer 154 may be a layer including a compound of copper, indium, and selenium (CIS). Alternatively, a layer including a compound of copper, indium, gallium, and selenium (CIGS) may be used. A photodiode including the CIS layer or the CIGS layer can also utilize avalanche multiplication similarly to the photodiode including a single layer of selenium. Since CIS and CIGS are p-type semiconductors, an n-type semiconductor such as cadmium sulfide or zinc sulfide may be provided in contact with the p-type semiconductor in order to form a junction.

A light-transmitting conductive film is preferably used as the electrode 153. For the electrode 153, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. In addition, the electrode 153 does not necessarily have a single-film structure, and may have a stacked structure of different films.

Each of the electrode 155 and the wiring 156 can be formed using molybdenum or tungsten, for example. The electrode 155 and the wiring 156 can be formed using a stacked structure in which aluminum and titanium are stacked, or a stacked structure in which an aluminum layer is provided between titanium layers, for example.

The partition 151 can be formed using an inorganic insulator, an insulating organic resin, or the like. The partition 151 may be colored black or the like in order to shield transistors and the like from light and/or to determine the area of a light-receiving portion in each pixel.

Alternatively, a PIN diode formed using an amorphous silicon film, a microcrystalline silicon film, or the like may be used as the photodiode PD.

Figure 21:
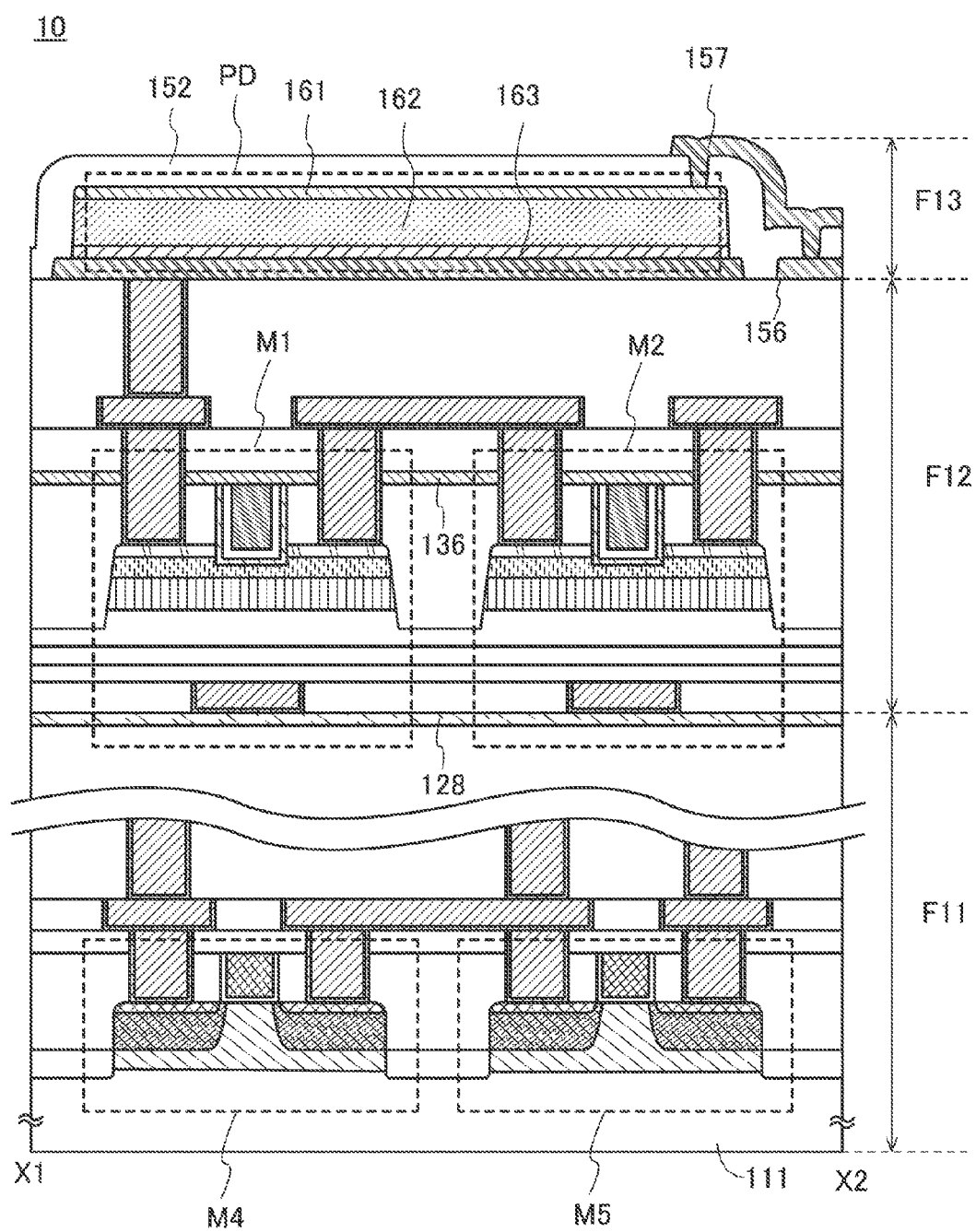
FIG. 21 is a cross-sectional diagram showing a structural example of a semiconductor device.

FIG. 21 illustrates an example in which a thin film PIN photodiode is used as the photodiode PD. In the photodiode, an n-type semiconductor layer 163, an i-type semiconductor layer 162, and a p-type semiconductor layer 161 are stacked in that order. The i-type semiconductor layer 162 is preferably formed using amorphous silicon. The p-type semiconductor layer 161 and the n-type semiconductor layer 163 can each be formed using amorphous silicon, microcrystalline silicon, or the like which includes a dopant imparting the corresponding conductivity type. A photodiode in which a photoelectric conversion layer is formed using amorphous silicon has high sensitivity in a visible light wavelength range, and therefore can easily detect weak visible light.

Figure 22:
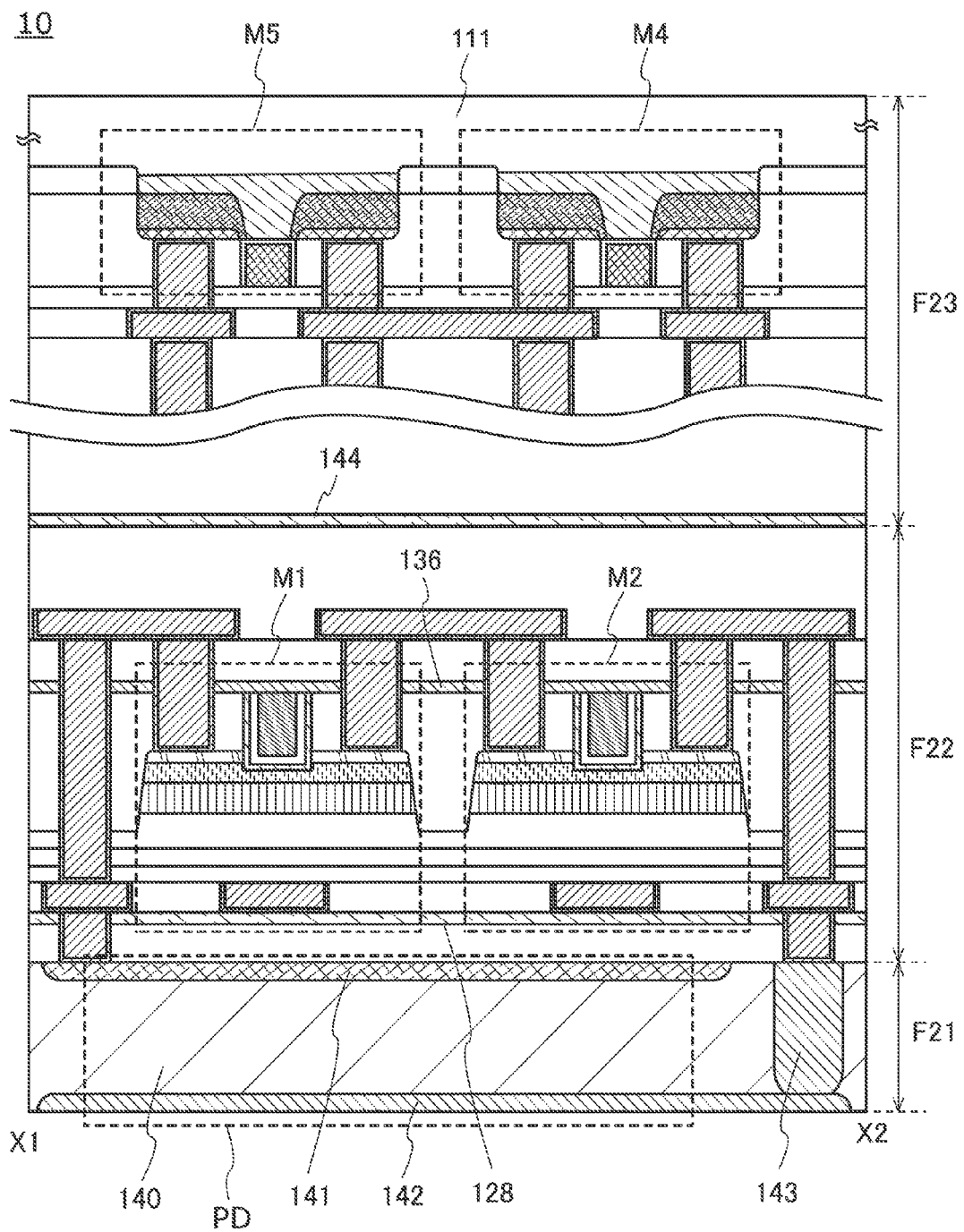
FIG. 22 is a cross-sectional diagram illustrating a structural example of a semiconductor device.

In addition, the semiconductor device 10 may be fabricated by bonding transistors that are fabricated on different substrates, as illustrated in FIG. 22. The semiconductor device 10 illustrated in FIG. 22 includes layers F21, F22, and F23.

The layer F21 includes a silicon substrate 140, an n-type silicon layer 141, a p-type silicon layer 142, and a conductive layer 143. The layer F21 forms the photodiode PD.

The layer F22 includes the transistors M1 and M2, the insulators 128 and 136, wirings, and plugs.

The layer F23 includes the substrate 111, transistors M4 and M5, an insulator 144, wirings, and plugs. The description of the insulators 136 and 128 can be referenced to understand the details of the insulator 144.

The semiconductor device 10 illustrated in FIG. 22 can be fabricated by the following method: the photodiode PD (the layer F21) and the transistors M1 and M2 (the layer F22) are formed over the silicon substrate 140, and the transistors M4 and M5 (the layer F23) are formed over the substrate 111; then, the silicon substrate 140 and the substrate 111 are bonded together. Note that the insulator 144 may be formed over the substrate 111, or over the silicon substrate 140. In addition, the silicon substrate 140 is preferably polished after the silicon substrate 140 and the substrate 111 are bonded together, so that the photodiode PD can be irradiated with light.

The configuration illustrated in FIG. 22 allows an increase in the effective size of the photodiode PD formed over the silicon substrate 140, increasing the sensitivity of the photodiode.

In FIG. 15, FIGS. 16A and 16B, FIG. 17, FIGS. 18A and 18B, FIGS. 19A and 19B, FIG. 20, FIG. 21 and FIG. 22, regions without reference numerals and hatch patterns represent regions formed with an insulator. As the insulator, an insulator containing at least one material selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in these regions, an organic resin such as a polyimide resin, a polyamide resin, an acrylic resin, a siloxane resin, an epoxy resin, or a phenol resin can be used.

Embodiment 3

In this embodiment, examples of a package and a camera module each including an image sensor chip are described. The image sensor chip may employ the structure of the semiconductor device 10 described in Embodiment 1.

Figure 23A:
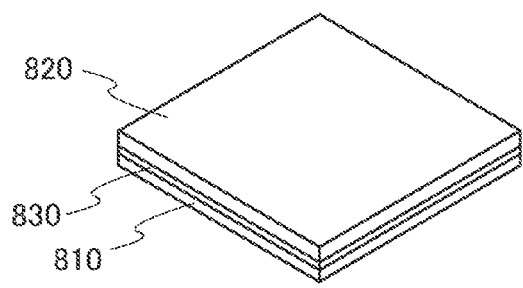
FIGS. 23A to 23D are perspective views and a cross-sectional diagram of a package containing a semiconductor device.

FIG. 23A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 23B:
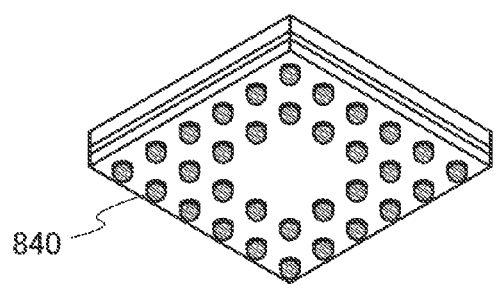

FIG. 23B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 23C:
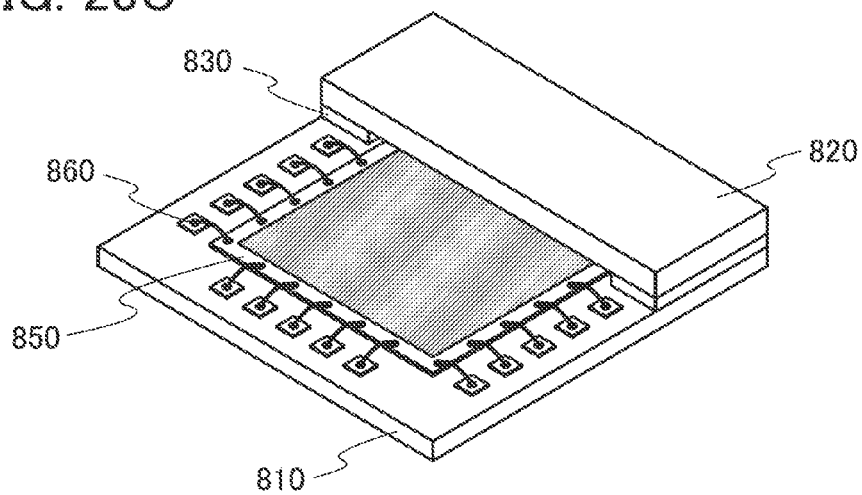
Figure 23D:
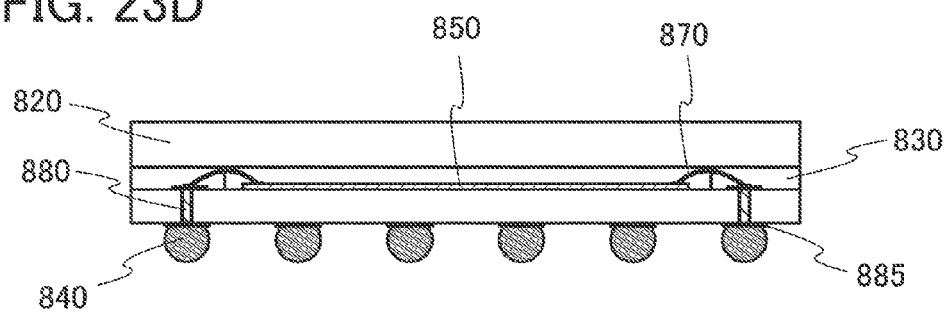

FIG. 23C is a perspective view of the package, in which the cover glass 820 and the adhesive 830 are partially illustrated. FIG. 23D is a cross-sectional diagram of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

FIG. 24A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

FIG. 24B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

FIG. 24C is a perspective view of the module, in which the lens cover 821 and the lens 835 are partly illustrated. FIG. 24D is a cross-sectional diagram of the camera module. The lands 841 are partly used as electrode pads 861. The electrode pads 861 are electrically connected to electrodes of the image sensor chip 851 and the IC chip 890 through wires 871.

Mounting the image sensor chip on the package having the above structure facilitates the implementation and enables the incorporation of the image sensor chip into a variety of semiconductor devices and electronic devices.

Embodiment 4

Examples of an electronic device that can use the semiconductor device according to one embodiment of the present invention include display devices, personal computers, image memory devices or image reproducing devices provided with storage media, mobile phones, game machines (including portable game machines), portable data terminals, e-book readers, cameras such as video cameras and digital still cameras, goggle-type displays (head-mounted displays), navigation systems, audio reproducing devices (e.g., car audio systems and digital audio players), copiers, facsimiles, printers, multifunction printers, automated teller machines (ATM), and vending machines. FIGS. 25A to 25F illustrate specific examples of these electronic devices.

FIG. 25A illustrates a monitoring camera, which includes a housing 951, a lens 952, a support portion 953, and the like. The semiconductor device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

FIG. 25B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The semiconductor device of one embodiment of the present invention can be included as a component for obtaining an image in the video camera.

FIG. 25C illustrates a digital camera, which includes a housing 961, a shutter button 962, a microphone 963, a light-emitting portion 967, a lens 965, and the like. The semiconductor device of one embodiment of the present invention can be included as a component for obtaining an image in the digital camera.

FIG. 25D illustrates a wrist-watch-type information terminal, which includes a housing 931, a display portion 932, a wristband 933, operation buttons 935, a winder 936, a camera 939, and the like. The display portion 932 may be a touch panel. The semiconductor device of one embodiment of the present invention can be included as a component for obtaining an image in the information terminal.

FIG. 25E illustrates a portable game machine, which includes housings 901 and 902, display portions 903 and 904, a microphone 905, speakers 906, an operation key 907, a stylus 908, a camera 909, and the like. Although the portable game machine in FIG. 25E has the two display portions 903 and 904, the number of display portions included in a portable game machine is not limited to this. The semiconductor device of one embodiment of the present invention can be included as one component for obtaining an image in the portable game machine.

FIG. 25F illustrates a portable data terminal that includes a housing 911, a display portion 912, a camera 919, and the like. The touch panel function of the display portion 912

Embodiment 5

In this embodiment, crystal structures of an oxide semiconductor that can be used for the OS transistors described in the above embodiments are described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. Furthermore, the term "perpendicular" indicates that the angle formed between two straight lines is greater than or equal to 80° and less than or equal to 100°. Accordingly, the term "perpendicular" includes the case where the angle formed between two straight lines is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned a-b plane anchored crystalline (CAAC)-OS, a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

In a combined analysis image (also referred to as a high-resolution TEM image) of a bright-field image and a diffraction pattern of a CAAC-OS film, which is obtained using a transmission electron microscope (TEM), a plurality of crystal parts can be observed. However, in the high-resolution TEM image, a boundary between crystal parts, that is, a grain boundary, is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting unevenness of a surface where the CAAC-OS film is formed (hereinafter, a surface where the CAAC-OS film is formed is also referred to as a formation surface) or a top surface of the CAAC-OS film, and is arranged parallel to the formation surface or the top surface of the CAAC-OS film.

On the other hand, according to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appears when 2θ is around 31° and that a peak does not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region in which a crystal part is observed and a region in which a crystal part is not clearly observed in a high-resolution TEM image. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystals is referred to as an nc-OS (nanocrystalline oxide semiconductor) film. In a high-resolution TEM image of the nc-OS film, for example, a grain boundary is not clearly observed in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak indicating a crystal plane does not appear. Further, a halo pattern is observed in a selected-area electron diffraction pattern of the nc-OS film obtained by using an electron beam having a probe diameter (e.g., 50 nm or larger) larger than the size of a crystal part. Meanwhile, spots are shown in a nanobeam electron diffraction pattern of the nc-OS film obtained by using an electron beam having a probe diameter close to or smaller than the size of a crystal part. Furthermore, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases.

The nc-OS film is an oxide semiconductor film that has high regularity as compared with an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Next, an amorphous oxide semiconductor film is described.

The amorphous oxide semiconductor film has disordered atomic arrangement and no crystal parts. For example, the amorphous oxide semiconductor film does not have a specific state as in quartz.

In a high-resolution TEM image of the amorphous oxide semiconductor film, crystal parts cannot be found.

When the amorphous oxide semiconductor film is subjected to structural analysis by an out-of-plane method with an XRD apparatus, a peak which indicates the existence of a crystal plane does not appear. A halo pattern is observed when the amorphous oxide semiconductor film is subjected to electron diffraction. Furthermore, no spots are observed and a halo pattern appears when the amorphous oxide semiconductor film is subjected to nanobeam electron diffraction.

Note that an oxide semiconductor film may have a structure having physical properties intermediate between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be observed. Furthermore, in the high-resolution TEM image, there are a region where a crystal part is clearly observed and a region where a crystal part is not observed. In some cases, growth of the crystal part occurs due to the crystallization of the a-like OS film, which is induced by a slight amount of electron beam employed in the TEM observation. In contrast, in the nc-OS film that has good quality, crystallization hardly occurs by a slight amount of electron beam used for TEM observation.

Note that the size of the crystal parts in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are stacked in the c-axis direction. Accordingly, the distance between the adjacent layers is equivalent to the lattice spacing on the (009) plane (also referred to as d value). The value is calculated to be 0.29 nm from crystal structural analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

Furthermore, the density of an oxide semiconductor film varies depending on the structure in some cases. For example, when the composition of an oxide semiconductor film is determined, the structure of the oxide semiconductor film can be estimated by comparing the density of the oxide semiconductor film with the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film having a density of lower than 78% of the density of the single crystal oxide semiconductor.

Specific examples of the above description are given. For example, in the case of an oxide semiconductor film having an atomic ratio of In:Ga:Zn=1:1:1, the density of single crystal $InGaZnO_4$ with a rhombohedral crystal structure is 6.357 $g/cm^3$. Accordingly, for example, in the case of the oxide semiconductor film having an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film having an atomic ratio of In:Ga:Zn=1:1:1, the density of each of the nc-OS film and the CAAC-OS film is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

Note that an oxide semiconductor film may be a stacked film including two or more films of an amorphous oxide semiconductor film, an a-like OS film, a microcrystalline oxide semiconductor film, and a CAAC-OS film, for example.

In this specification and the like, terms for describing arrangement, such as "over" and "under", are used for convenience to indicate a positional relation between components with reference to drawings. Furthermore, the positional relation between components is changed as appropriate in accordance with a direction in which the components are described. Therefore, the terms for describing arrangement are not limited to those used in this specification and may be changed to other terms as appropriate depending on the situation.

Furthermore, in a block diagram in this specification and the like, components are functionally classified and shown by blocks that are independent from each other. However, in an actual circuit and the like, functional classification of such components is difficult, and there may be a case in which a plurality of functions are included in one circuit, or a case in which a plurality of circuits pertain to one function. Therefore, blocks in a block diagram do not necessarily show components described in the specification, which can be described with other terms as appropriate depending on the situation.

In this specification and the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Note that potential is a relative concept, and the potential applied to a wiring or the like is changed depending on the reference potential, in some cases.

In this specification and the like, the terms "film" and "layer" can be used interchangeably depending on the case or circumstances. For example, the term "conductive layer" can be changed into the term "conductive film" in some cases. Also, the term "insulating film" can be changed into the term "insulating layer" in some cases.

In this specification and the like, a "switch" can switch between being conductive (on state) and being non-conductive (off state); a "switch" thus has a function of controlling whether a current flows through it or not. Alternatively, a switch has a function of selecting and changing a current path.

Examples of a switch include an electrical switch, and a mechanical switch. In other words, any element can be used as a switch as long as it can control current, and a switch is not limited to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

For example, in this specification and the like, an explicit description "X and Y are connected" means that X and Y are electrically connected, and X and Y are directly connected. Accordingly, the connections in this specification and the like are not limited to the predetermined connections, e.g., those in the drawings or texts, and may include connections that are not in the drawings or texts, which may be included in either of the drawings or texts.

Here, X and Y each denote an object (e.g., a device, an element, a circuit, a wiring, an electrode, a terminal, a conductive film, or a layer).

Examples of the case in which X and Y are directly connected include a case in which X and Y are connected without elements that enable an electrical connection between X and Y, such as a switch, a transistor, a capacitor, an inductor, a resistor, a diode, a display element, a light-emitting element, or a load, connected between X and Y.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the case where X and Y are electrically connected includes the case where X and Y are directly connected.

This application is based on Japanese Patent Application serial No. 2015-188047 filed with Japan Patent Office on Sep. 25, 2015, the entire contents of which are hereby incorporated by reference.

What is claimed is:

1. A semiconductor device comprising:
   a pixel portion configured to obtain an imaging data;
   a first circuit configured to perform discrete cosine transform on the imaging data and generate a first data which is an analog data;

a memory configured to store the first data; and
a second circuit configured to perform discrete cosine transform on the first data and generate a second data.

2. The semiconductor device according to claim 1,
wherein the pixel portion comprises a photodiode and a transistor, and
wherein a channel formation region of the transistor comprises an oxide semiconductor.

3. The semiconductor device according to claim 1, wherein each of the first circuit and the second circuit is an analog processing circuit.

4. The semiconductor device according to claim 1,
wherein the first circuit is configured to perform discrete cosine transform in one of the x-axis direction and the y-axis direction on the imaging data, and
wherein the second circuit is configured to perform discrete cosine transform in the other of the x-axis direction and the y-axis direction on the first data.

5. The semiconductor device according to claim 1,
wherein the memory comprises a first transistor, a second transistor, and a capacitor,
wherein a channel formation region of the first transistor comprises an oxide semiconductor, and
wherein a channel formation region of the second transistor comprises silicon.

6. A camera module comprising:
the semiconductor device according to claim 1; and
a lens.

7. A semiconductor device comprising:
a pixel portion configured to obtain a first imaging data, a second imaging data, and a third imaging data which is a difference between the first imaging data and the second imaging data;
a first circuit configured to perform discrete cosine transform on the third imaging data and generate a first data which is an analog data;
a memory configured to store the first data; and
a second circuit configured to perform discrete cosine transform on the first data and generate a second data.

8. The semiconductor device according to claim 7,
wherein the pixel portion comprises a photodiode and a transistor, and
wherein a channel formation region of the transistor comprises an oxide semiconductor.

9. The semiconductor device according to claim 7, wherein each of the first circuit and the second circuit is an analog processing circuit.

10. The semiconductor device according to claim 7,
wherein the first circuit is configured to perform discrete cosine transform in one of the x-axis direction and the y-axis direction on the third imaging data, and
wherein the second circuit is configured to perform discrete cosine transform in the other of the x-axis direction and the y-axis direction on the first data.

11. The semiconductor device according to claim 7,
wherein the memory comprises a first transistor, a second transistor, and a capacitor,
wherein a channel formation region of the first transistor comprises an oxide semiconductor, and
wherein a channel formation region of the second transistor comprises silicon.

12. A camera module comprising:
the semiconductor device according to claim 7; and
a lens.

* * * * *